(12) United States Patent
Tanaka et al.

(10) Patent No.: US 7,893,796 B2
(45) Date of Patent: Feb. 22, 2011

(54) HIGH FREQUENCY DEVICE, POWER SUPPLY DEVICE AND COMMUNICATION APPARATUS

(75) Inventors: Masahiro Tanaka, Kanagawa (JP); Shun Mitarai, Kanagawa (JP); Masahiro Tada, Kangawa (JP); Koji Naniwada, Tokyo (JP)

(73) Assignee: Sony Corporation, Tokyo (JP)

( * ) Notice: Subject to any disclaimer, the term of this patent is extended or adjusted under 35 U.S.C. 154(b) by 1098 days.

(21) Appl. No.: 11/570,642

(22) PCT Filed: Jun. 7, 2005

(86) PCT No.: PCT/JP2005/010756

§ 371 (c)(1), (2), (4) Date: Dec. 14, 2006

(87) PCT Pub. No.: WO2005/125007

PCT Pub. Date: Dec. 29, 2005

(65) Prior Publication Data

US 2008/0272749 A1    Nov. 6, 2008

(30) Foreign Application Priority Data

Jun. 18, 2004    (JP) ............................. 2004-181459

(51) Int. Cl.
H03H 9/46    (2006.01)
(52) U.S. Cl. ...................................... 333/186; 333/197
(58) Field of Classification Search .................. 333/186, 333/197
See application file for complete search history.

(56) References Cited

U.S. PATENT DOCUMENTS

| | | | | |
|---|---|---|---|---|
| 6,147,549 A | * | 11/2000 | Ohno | 327/541 |
| 6,713,938 B2 | * | 3/2004 | Nguyen | 310/309 |
| 6,741,137 B1 | * | 5/2004 | Sibrai et al. | 331/109 |
| 7,023,189 B2 | * | 4/2006 | Peng et al. | 323/274 |
| 7,352,254 B2 | * | 4/2008 | Tanaka | 331/116 M |
| 7,401,515 B2 | * | 7/2008 | Weber | 73/504.12 |
| 7,463,105 B2 | * | 12/2008 | Morita et al. | 331/154 |
| 7,498,901 B2 | * | 3/2009 | Naniwada et al. | 333/133 |
| 2003/0048520 A1 | * | 3/2003 | Ma et al. | 359/295 |
| 2004/0245979 A1 | * | 12/2004 | Ikoma et al. | 323/364 |

FOREIGN PATENT DOCUMENTS

| | | |
|---|---|---|
| JP | 05-111150 | 4/1993 |
| JP | 2003-071798 | 3/2003 |
| JP | 2003-532320 | 10/2003 |
| JP | 2004-112944 | 4/2004 |

OTHER PUBLICATIONS

Clark et al., Parallel-resonator HF micromechanical bandpass filter, Jun. 16-19, 1997, Solid State Senstors and Actuators 1997 vol. 2, p. 1161-1164.*

International Search Report dated Sep. 20, 2005.

* cited by examiner

*Primary Examiner*—Robert Pascal
*Assistant Examiner*—Alan Wong
(74) *Attorney, Agent, or Firm*—SNR Denton US LLP

(57) ABSTRACT

A high frequency device including an electrostatic type vibrator, a pad, and a circuit. The electrostatic type vibrator is operable via a DC bias voltage. The pad is configured to supply the DC bias voltage. The circuit is positioned electrically between the pad and the vibrator. The circuit is configured to stabilize the DC bias voltage. The circuit and the high frequency signal device are on a common substrate.

11 Claims, 22 Drawing Sheets

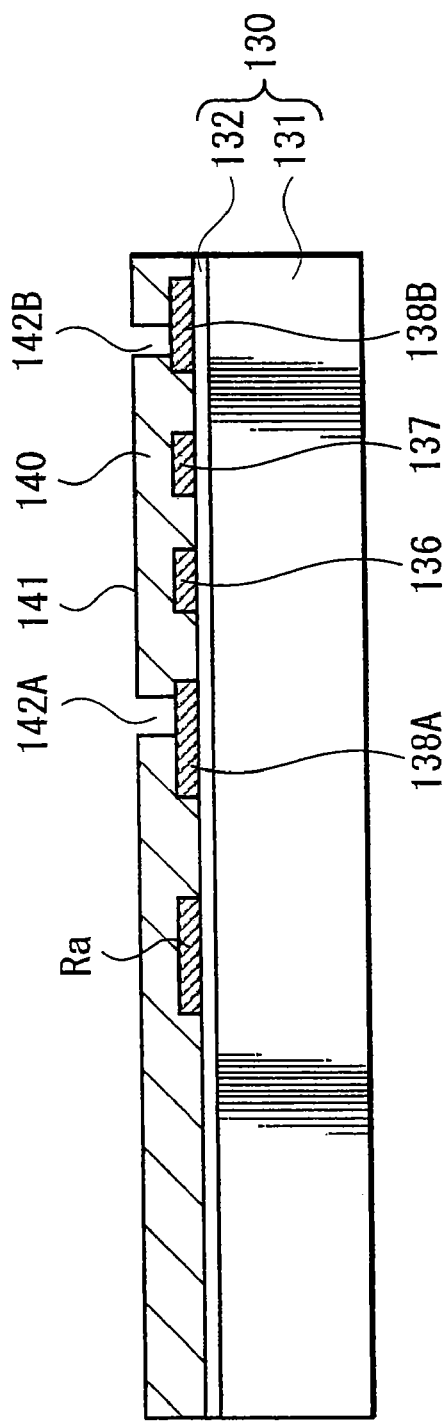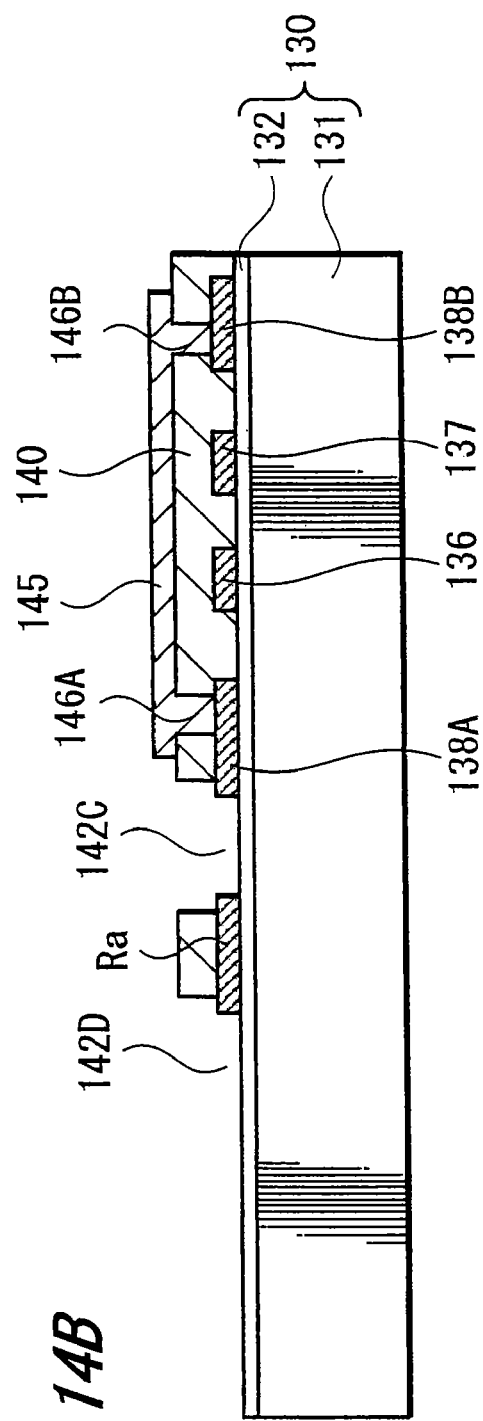

HIGH FREQUENCY DEVICE, POWER SUPPLY DEVICE AND COMMUNICATION APPARATUS

TECHNICAL FIELD

The present invention relates to a high frequency device having a high frequency signal device in which an electrostatic type vibrator is made to be a component thereof and DC voltage supply means for supplying a DC bias voltage to this high frequency signal device.

Also, the present invention relates to a power supply device for supplying a DC bias voltage to aforesaid high frequency signal device.

Also, the present invention relates to a communication apparatus using a filter constituted by aforesaid high frequency device.

BACKGROUND ART

In a high frequency signal device having an electrostatic type vibrator as a component thereof, a DC bias voltage is applied to that vibrator. In case of supplying a DC bias voltage to such an electrostatic type vibrator, if, for example, the supply thereof is carried out by using a simple transmission line, there is a fear that a voltage fluctuating in accordance with unstability of the DC feeding circuit or a high voltage generated by some factors may be applied to an electrode (so-called, drive portion or lower electrode of vibrator) driving the vibrator. In such a case, fluctuation of a vibration amplitude of the vibrator occurs and it causes fluctuation of a signal processing characteristic of a high frequency signal device. In a case when the voltage fluctuation is significant, it becomes a state in which the vibrator cannot recover caused by a phenomenon that the drive portion and the lower electrode of the vibrator are firmly fixed, discharge occurs between the drive portion and the lower electrode, abnormal vibration is generated or the like.

For example, there has been proposed a high frequency filter constituted by using a MEMS (Micro Electro Mechanical System) device, but it is difficult in such a high frequency filter to obtain a preferable filter characteristic, because time fluctuation of the vibrator impedance occurs if fluctuation of the DC bias voltage occurs. In a case when a semiconductor integrated circuit is constituted by installing the MEMS device in a digital circuit, a power supply is commonly used for a drive circuit of a digital signal processing portion and for the MEMS device and the stability thereof is not heightened particularly, so that there is a fear of characteristic fluctuation of the MEMS device caused by voltage fluctuation of the power supply. A high frequency filter utilizing a MEMS device is proposed from research institutes starting from University of Michigan (see Non-patent Document 1).

[Non-patent Document 1] C.T.-Nguyen, Micromechanical components for miniaturized low-power communications (invited plenary), proceedings, 1999 IEEE MIT-S International Microwave Symposium RF MEMS Workshop, Jun. 18, 1999, pp. 48-77.

DISCLOSURE OF THE INVENTION

When handling a weak signal in a high frequency range, for example, when carrying out filtering of a high frequency (RF) signal, fluctuation of the DC bias voltage applied to the vibrator causes impedance fluctuation of the vibrator and fluctuation of signal strength after filtering is brought about. Consequently, a fact that the direct current (DC) bias supply circuit is stable is the most important issue for obtaining a preferable filtering characteristic.

The present invention is to provide a high frequency device having supply means in which stability improvement of a DC bias voltage applied to an electrostatic type vibrator is attempted.

Also, there is provided a power supply device which can supply a stable DC bias voltage to the aforesaid vibrator.

Also, the present invention provides a communication apparatus in which high reliability is attempted by using a filter which is constituted by the aforesaid high frequency device.

A high frequency device relating to the present invention has a high frequency signal device including an electrostatic type vibrator operated by being applied with a DC bias voltage and is constituted by being added between a pad supplying the DC bias voltage and the vibrator with a circuit having a function of stabilizing the DC bias voltage.

A power supply device relating to the present invention is a power supply device for driving a high frequency signal device which includes an electrostatic type vibrator operated by being applied with a DC bias voltage and is constituted by being added with a circuit having a function of stabilizing the DC bias voltage.

A communication apparatus relating to the present invention, in a communication apparatus including a filter for carrying out band limitation of a transmission signal and/or a reception signal, has an electrostatic drive type vibrator operated by being applied with a DC bias voltage as the filter and is constituted to be added between a pad supplying the DC bias voltage and the vibrator with a circuit having a function of stabilizing the DC bias voltage.

According to a high frequency device relating to the present invention, it is possible to repress time fluctuation of an outputted high frequency signal by adding a circuit having a function of stabilizing a DC bias voltage between a pad supplying the DC bias voltage and an electrostatic type vibrator and by supplying a stable DC bias voltage to the electrostatic type vibrator. Also, it is possible to prevent destruction of the vibrator caused by a high voltage pulse (surge voltage) which is applied thereto suddenly.

According to a power supply device of the present invention, there is added with a circuit having a function of increasing stability of a DC voltage, so that when applying a DC bias voltage to an electrostatic type vibrator through this power supply device, the DC bias voltage is never made to fluctuate and it is possible to repress impedance fluctuation of the vibrator and to obtain a high frequency signal of stable signal strength.

According to a communication apparatus of the present invention, it is possible to repress time fluctuation of an outputted high frequency signal or/and intermediate frequency signal by adding a circuit having a function of stabilizing a DC bias voltage between an electrostatic drive type vibrator constituting a filter and a pad supplying the DC bias voltage and by supplying a stable DC bias voltage to the electrostatic drive type vibrator and also, it is possible to prevent destruction of the vibrator caused by a high voltage pulse (surge voltage) applied thereto suddenly and it is possible to provide a communication apparatus having high reliability.

BRIEF DESCRIPTION OF DRAWINGS

FIGS. 14A and 14B are manufacturing process diagrams (No. 3 thereof) showing one exemplified embodiment of a manufacturing method of a high frequency device relating to the present invention;

BEST MODE FOR CARRYING OUT THE INVENTION

Figure 1A:
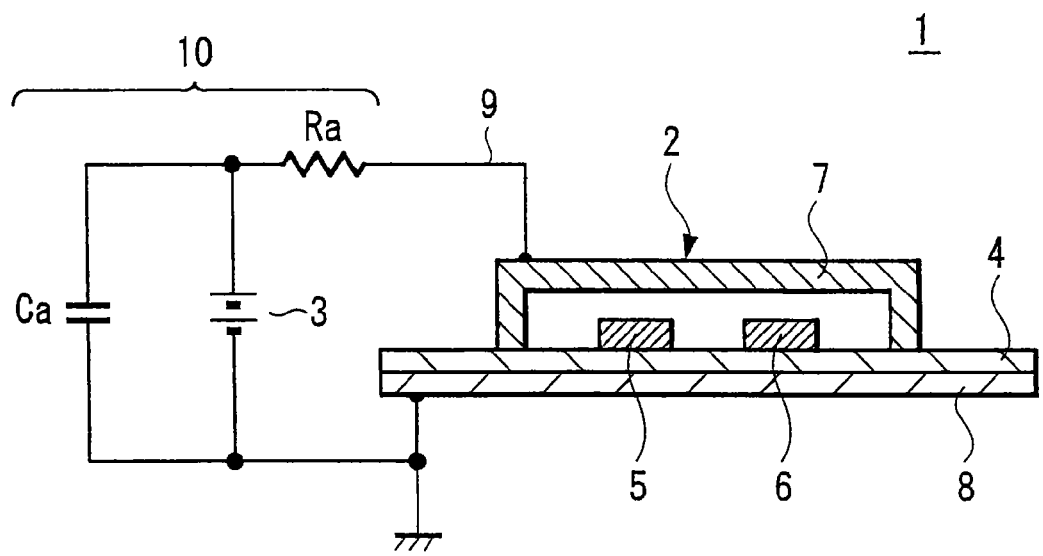
FIGS. 1A and 1B are conceptual diagrams showing a first fundamental constitution of a high frequency device relating to the present invention.

A high frequency device relating to an exemplified embodiment of the present invention has a high frequency device including an electrostatic type vibrator operated by being applied with a DC bias voltage and is constituted by being added with a circuit having a function of stabilizing a DC bias voltage between a pad supplying the DC bias voltage and the vibrator.

It is possible for the high frequency signal device to be constituted so as to have a vibrator group which carries out a signal process by passing a high frequency signal through a plurality of electrostatic type vibrators in parallel as a circuit element.

It is possible for the circuit having a function of stabilizing the DC bias voltage to be constituted by a resistor inserted to a DC feed line serially and a capacitor inserted between this DC feed line and the ground.

Also, it is possible for the circuit having function of stabilizing the DC bias voltage to be provided on a same substrate on which the high frequency signal device is formed.

It is possible for the high frequency signal device to be constituted so as to have a function of discriminating a desired frequency band signal from an inputted high frequency signal.

It is possible for the high frequency signal device to be constituted so as to have a function of generating a reference signal of a high frequency signal.

A power supply device relating to an exemplified embodiment of the present invention is a power supply device for driving a high frequency signal device which includes an electrostatic type vibrator operated by being applied with a DC bias voltage and is constituted by being added with a circuit having a function of stabilizing the DC bias voltage.

A communication apparatus relating to an exemplified embodiment of the present invention, in a communication apparatus including a filter for carrying out band limitation of a transmission signal and/or a reception signal, has an electrostatic drive type vibrator operated by being applied with a DC bias voltage as the filter and is constituted to be added between a pad supplying the DC bias voltage and the vibrator with a circuit having a function of stabilizing the DC bias voltage.

It is possible for the aforesaid filter to be constituted so as to have a vibrator group which carries out a signal process by passing a high frequency signal or an intermediate frequency signal through a plurality of electrostatic drive type vibrators in parallel as a circuit element.

It is possible for the circuit having a function of stabilizing the DC bias voltage to be constituted by a resistor inserted to a DC feed line serially and a capacitor inserted between an electric supply line and the ground.

It is possible for the circuit having a function of stabilizing the DC bias voltage to be provided on a same substrate on which the filter is formed.

According to a high frequency device relating to an exemplified embodiment of the present invention, it is possible to repress time fluctuation of an output high frequency signal by adding a circuit having a function of stabilizing a DC bias voltage between a pad supplying the DC bias voltage and an electrostatic type vibrator and by supplying a stable DC bias voltage to the electrostatic type vibrator. Also, it is possible to prevent destruction of the vibrator caused by a high voltage pulse (surge voltage) which is applied thereto suddenly.

The high frequency device relating to an exemplified embodiment of the present invention can be constituted as a high frequency filter, for example, a ladder type filter by using an electrostatic type vibrator in the high frequency signal device. Then, it is possible to suppress time fluctuation of the filtered high frequency signal by applying a stable DC bias voltage to a drive portion or a lower electrode of the vibrator which becomes a high frequency signal selection device. Also, it is possible to minimize the damage to the vibrator caused by a surge voltage which cannot recover.

It is possible for the high frequency device of an exemplified embodiment of the present invention to be constituted as a reference signal generator by using an electrostatic drive type device in the high frequency signal device. Then, it is possible to suppress strength and time fluctuation of center frequency in a generated signal by applying a stable DC bias voltage to a drive portion or a lower electrode of the vibrator which becomes a high frequency signal generation device. Also, it is possible to minimize the damage to the vibrator caused by a surge voltage from outside which cannot recover.

The high frequency device of an exemplified embodiment of the present invention can be constituted as a compound vibrator type filter by using electrostatic type vibrators in a high frequency signal device and by coupling these plurality of vibrators mechanically. Then, it is possible to suppress time fluctuation of the filtered high frequency signal by applying a stable DC bias voltage to drive portions or lower electrodes of the vibrators which constitute a compound vibrator type filter. Also, it is possible to minimize the damage to the vibrator caused by a surge voltage which cannot recover.

According to a power supply device of an exemplified embodiment of the present invention, there is added with a circuit having a function of increasing stability of a DC voltage, so that when applying a DC bias voltage to an electrostatic type vibrator through this power supply device, the DC bias voltage is never made to fluctuate and it is possible to repress impedance fluctuation of the vibrator and to obtain a high frequency signal of a stable signal strength.

According to a communication apparatus of an exemplified embodiment of the present invention, it is possible to repress time fluctuation of an outputted high frequency signal or/and intermediate frequency signal by adding a circuit having a function of stabilizing a DC bias voltage between an electrostatic drive type vibrator constituting a filter and a pad supplying the DC bias voltage and by supplying a stable DC bias voltage to the electrostatic drive type vibrator and also, it is possible to prevent destruction of the vibrator caused by a high voltage pulse (surge voltage) applied thereto suddenly and it is possible to provide a communication apparatus having high reliability.

Hereinafter, exemplified embodiments of the present invention will be explained with reference to drawings.

Figure 1B:
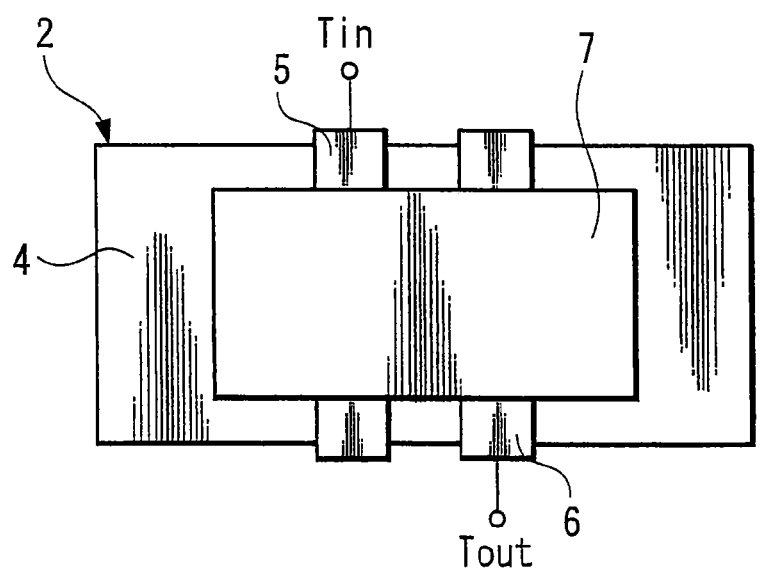

First, there is shown in FIG. 1 a first fundamental constitution (concept) of a high frequency device relating to the present invention. This high frequency device 1 is formed as shown in FIGS. 1A and 1B by being provided with a high frequency signal device including an electrostatic type vibrator 2 and a DC power supply 3 which becomes DC voltage supply means for supplying a DC bias voltage to this vibrator 2. The vibrator 2 is constituted by arranging lower electrodes, that is, an input electrode 5 and an output electrode 6 which are placed apart from each other by a necessary distance on a front face of a substrate 4 and by arranging a vibration portion, so-called, a beam (BEAM) type vibration electrode (hereinafter, referred to as beam) 7 which strides over these input/output electrodes 5 and 6 in a bridge shape. There is formed a ground surface 8 on the rear face of the substrate 4. The DC power supply 3 is connected between the beam 7 and the ground surface 8. Further, a resistor Ra is inserted serially in a feed line 9 between the DC power supply 3 and the beam 7, a capacitor (shunt capacitor) Ca is inserted between the feed line 9 and the ground surface 8 and a DC voltage stabilization circuit 10 for stabilizing the DC bias voltage is formed by these resistor Ra and capacitor Ca.

In the vibrator 2 of this high frequency device 1, when a high frequency signal is inputted to the input electrode 5 through an input terminal Tin, the beam 7 resonates according to an electrostatic force occurring between the beam 7 supplied with the DC bias voltage from the DC power supply 3 and the input electrode 5, and a high frequency signal of a desired frequency is outputted from the output electrode 6 through an output terminal Tout. Then, the vibrator 2 is supplied with a stable DC bias voltage through the DC voltage stabilization circuit 10, so that it is possible to repress time fluctuation of the outputted high frequency signal. Also, it is possible to prevent destruction of the vibrator 2 caused by a high voltage pulse (surge voltage) which is applied suddenly.

Figure 2:
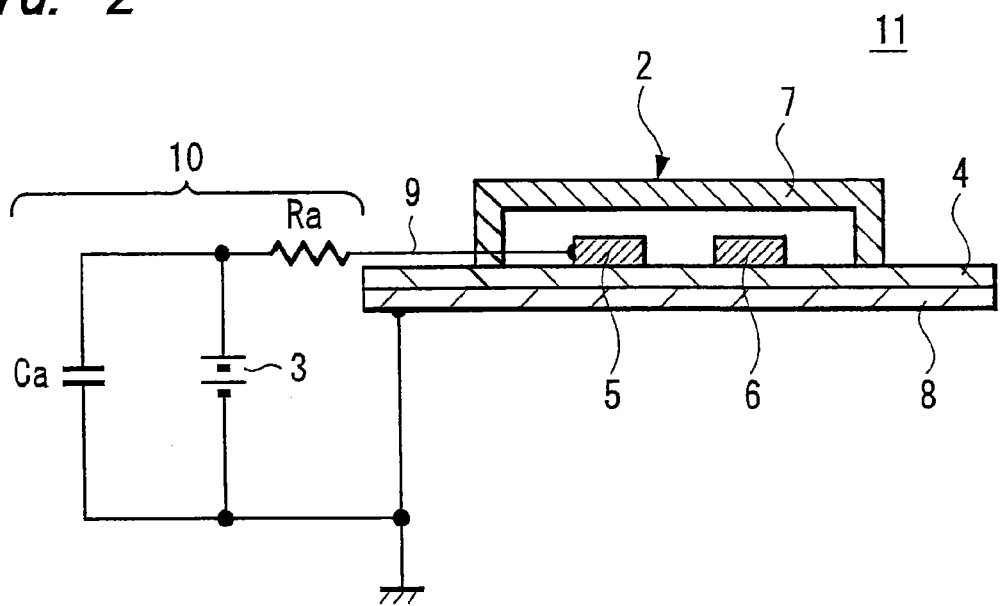
FIG. 2 is a conceptual diagram showing a second fundamental constitution of a high frequency device relating to the present invention.

In FIG. 2, there is shown a second fundamental constitution (concept) of a high frequency device of the present invention. This high frequency device 11 is provided with a high frequency signal device including the vibrator 2 having a similar constitution as that of FIG. 1 and is constituted by connecting the DC power supply 3 between the input electrode 5 and the ground surface 8, inserting the resistor Ra serially in the feed line 9 between the DC power supply 3 and the input electrode 5, inserting the capacitor Ca between this feed line 9 and the ground surface 8 and forming the DC voltage stabilization circuit 10 by the resistor Ra and the capacitor Ca. The beam 7 is made to be in an electrically floating state.

In the vibrator 2 of this high frequency device 11, the input electrode 5 is inputted in a form in which the DC bias voltage and the high frequency signal are superimposed. The operation and effects of the vibrator 2 of this high frequency device 11 is similar to the high frequency device 1 of FIG. 1 fundamentally.

Figure 3:
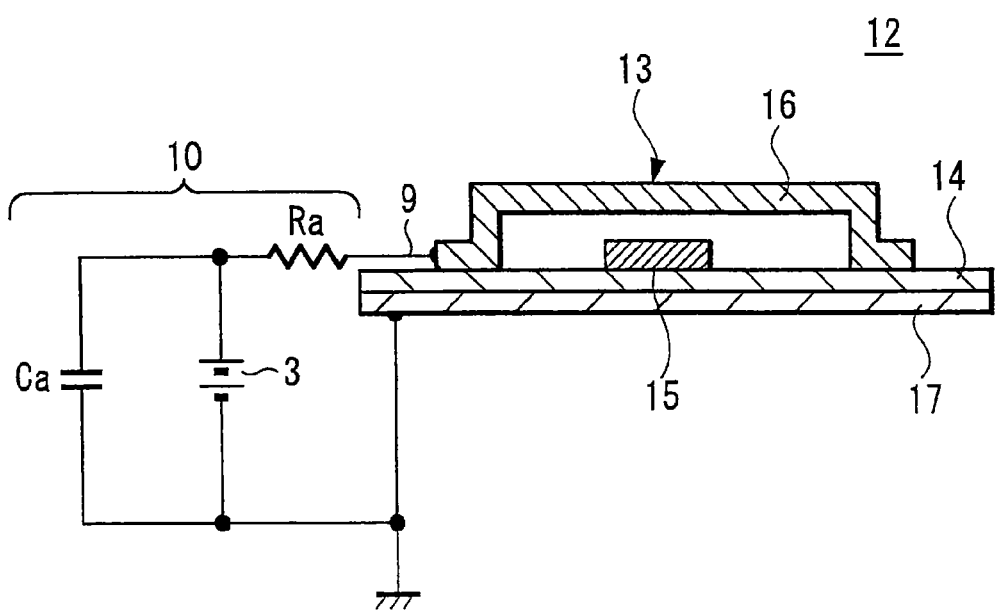
FIG. 3 is a conceptual diagram showing a third fundamental constitution of a high frequency device relating to the present invention.

In FIG. 3, there is shown a third fundamental constitution (concept) of a high frequency device of the present invention. This high frequency device 12 is formed by being provided with a high frequency signal device including an electrostatic type vibrator 13 and the DC power supply 3 which becomes DC voltage supply means for supplying a DC bias voltage to the vibrator 13. The vibrator 13 is constituted by arranging a lower electrode 15 on a front face of a substrate 14 and by arranging a beam 16 which strides over this lower electrode 15 in a bridge shape. On the rear face of the substrate 14, there is formed a ground surface 17. The DC power supply 3 is connected between the beam 16 and the ground surface 17. Further, a resistor Ra is inserted serially in a feed line 9 between the DC power supply 3 and the beam 16, a capacitor (shunt capacitor) Ca is inserted between this feed line 9 and the ground surface 17 and a DC voltage stabilization circuit 10 for stabilizing the DC bias voltage is formed by these resistor Ra and capacitor Ca.

In the vibrator 13 of this high frequency device 12, the beam 16 becomes an input electrode and the lower electrode 15 becomes an output electrode. When an input is applied to the beam 16 in a form in which the DC bias voltage and the high frequency signal are superimposed, the beam 16 resonates according to an electrostatic force occurring between the beam 16 and the lower electrode (output electrode) 15, and a high frequency signal of a desired frequency is outputted from the lower electrode 15. Then, the vibrator 13 is supplied with a stable DC bias voltage through the DC voltage stabilization circuit 10, so that it is possible to repress time fluctuation of the outputted high frequency signal. Also, it is possible to prevent destruction of the vibrator 13 caused by a high voltage pulse (surge voltage) which is applied suddenly.

In FIG. 4 to FIG. 7, there are shown outlines of exemplified embodiments of the high frequency device according to the present invention.

Figure 4:
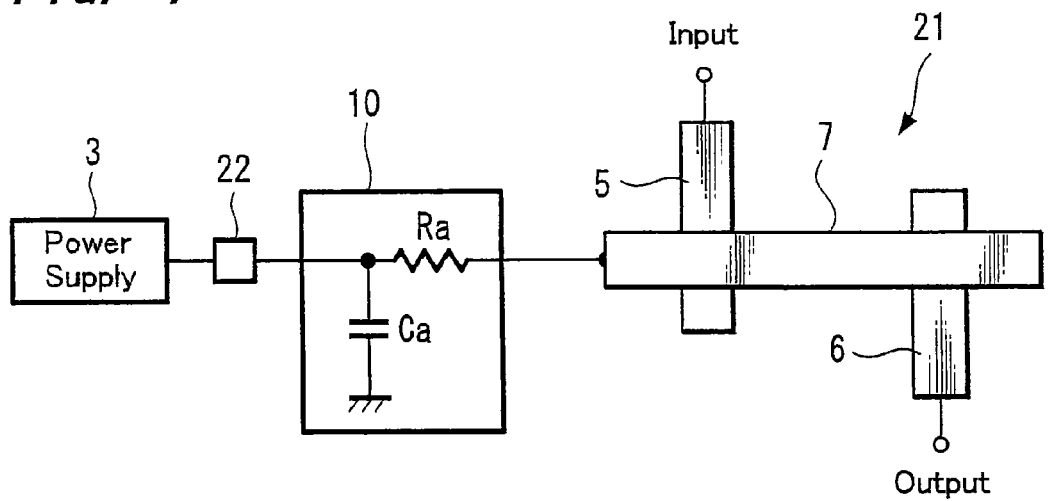
FIG. 4 is a schematic diagram of an exemplified embodiment in case of forming a filter by one MEMS electrostatic drive type vibrator.

It is possible for a high frequency signal device to be formed by a filter composed of a MEMS electrostatic drive type vibrator. At that time, in a case when, for example, the filter is fabricated by a single MEMS electrostatic drive type vibrator 21, it is possible for the RC circuit (DC voltage stabilization circuit) 10 for stabilizing the DC voltage which is constituted by the above-mentioned resistor Ra and capacitor Ca to be connected, as shown in FIG. 4, between a DC power supply input pad to the filter, that is, a DC power supply input pad 22 connected to the DC power supply and the beam 7 of the single vibrator 21.

Figure 5:
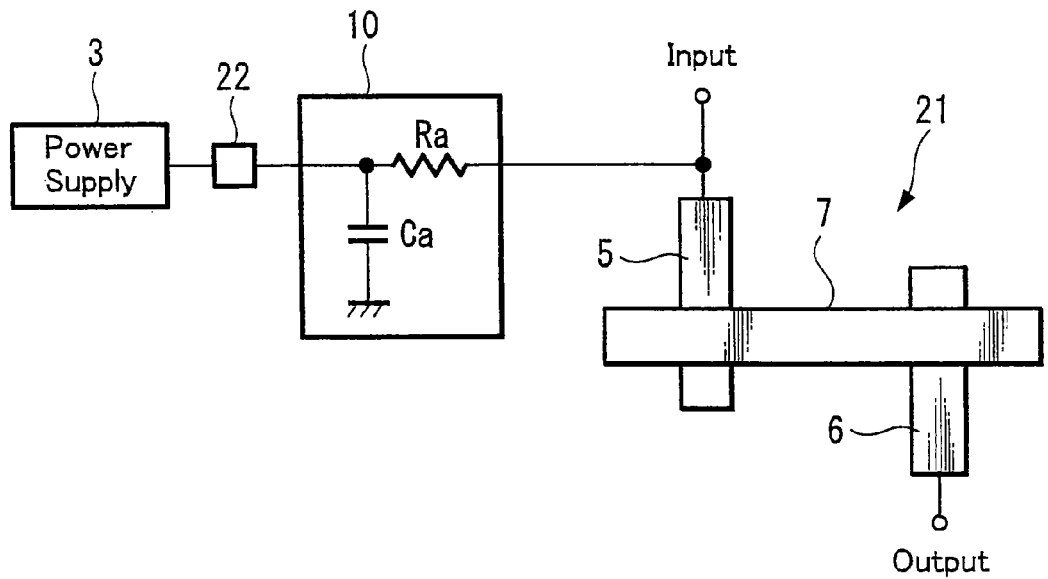
FIG. 5 is a schematic diagram of another exemplified embodiment in case of forming a filter by one MEMS electrostatic drive type vibrator.

Also, in a case when the filter is fabricated similarly by the single MEMS electrostatic drive type vibrator 21, it is possible for the RC circuit (DC voltage stabilization circuit) 10 for stabilizing the DC voltage which is constituted by the above-mentioned resistor Ra and capacitor Ca to be connected, as shown in FIG. 5, between a DC power supply input pad to the filter, that is, a DC power supply input pad 22 connected to the DC power supply 3 and the input electrode 5 of the single vibrator 21.

Figure 6:
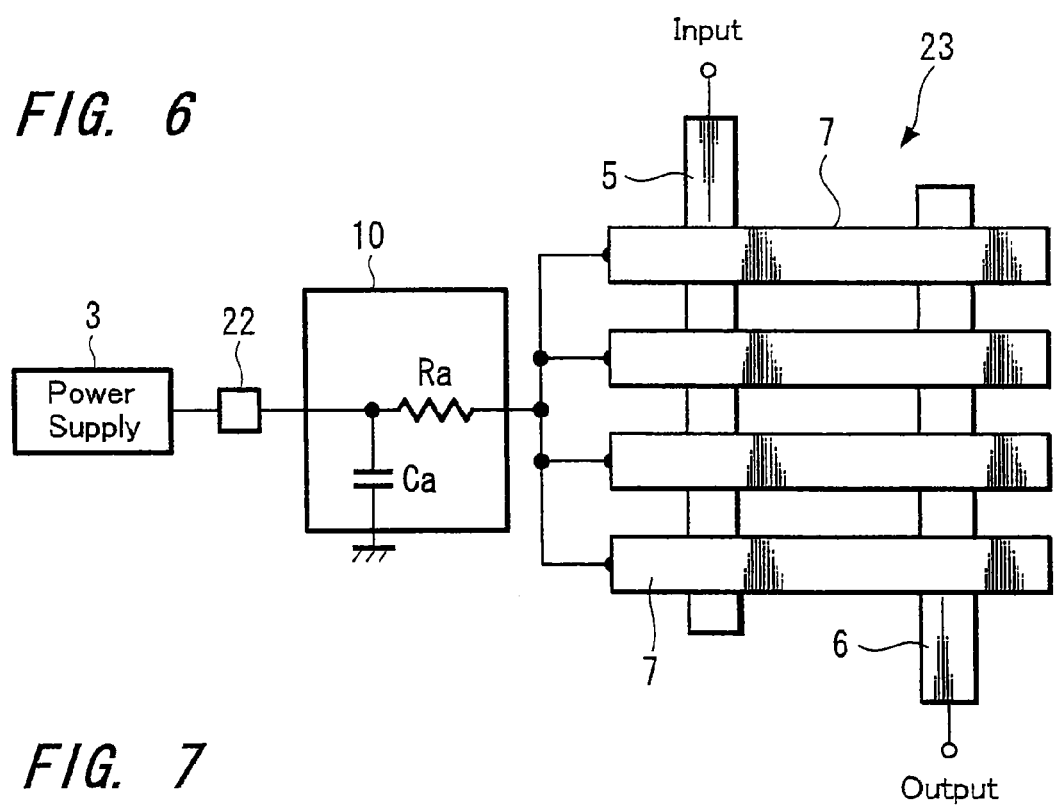
FIG. 6 is a schematic diagram of an exemplified embodiment in case of forming a filter by a plurality of parallelized MEMS electrostatic drive type vibrators.

Also, in a case when, for example, the filter is fabricated by a plurality of MEMS electrostatic drive type vibrators 23 in which the beams 7 are parallelized, it is possible for the RC circuit (DC voltage stabilization circuit) 10 for stabilizing the DC voltage which is constituted by the above-mentioned resistor Ra and capacitor Ca to be connected, as shown in FIG. 6, between a DC power supply input pad to the filter, that is, a DC power supply input pad 22 connected to the DC power supply 3 and the plurality of vibrators 23, that is, the parallelized beams 7.

Figure 7:
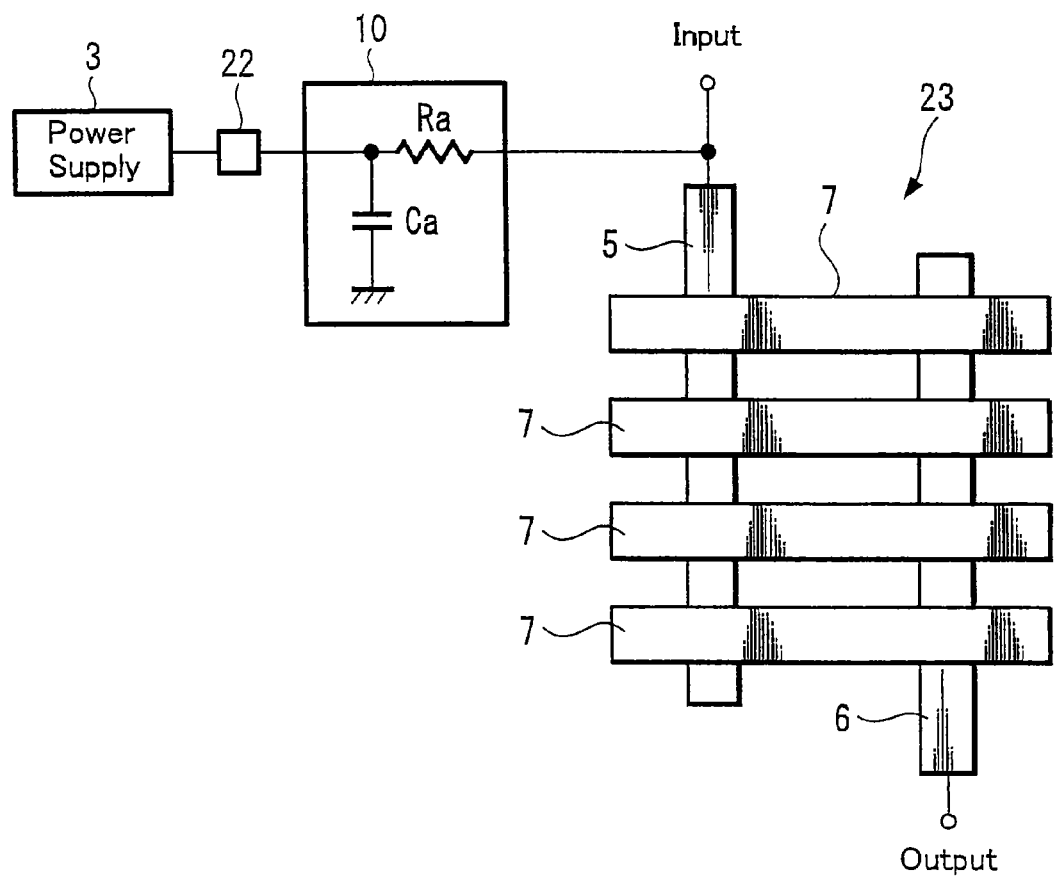
FIG. 7 is a schematic diagram of another exemplified embodiment in case of forming a filter by a plurality of parallelized MEMS electrostatic drive type vibrators.

Also, in a case when the filter is fabricated similarly by a plurality of MEMS electrostatic drive type vibrators 23 in which the vibration electrodes are parallelized, it is possible for the RC circuit (DC voltage stabilization circuit) 10 for stabilizing the DC voltage which is constituted by the above-mentioned resistor Ra and capacitor Ca to be connected, as shown in FIG. 7, between a DC power supply input pad to the filter, that is, a DC power supply input pad 22 connected to the DC power supply 3 and the plurality of vibrators 23, that is, the input electrode 5 thereof.

The RC circuit (DC voltage stabilization circuit) 10 for stabilizing the DC voltage mentioned above can be formed on a same substrate together with the filter.

Although not shown, it is also possible to form the above-mentioned RC circuit (DC voltage stabilization circuit) 10 as a portion of a transmission line which is formed between the DC power supply input pad 22 to the filter and the DC power supply 3 for driving the MEMS electrostatic drive type vibrator of the filter shown in FIG. 4 to FIG. 7.

In the aforesaid filter, it is also possible for the MEMS electrostatic drive type vibrator to be constituted by being replaced with the constitution in FIG. 3.

It is possible for the high frequency signal device relating to this exemplified embodiment to be formed by a reference signal generator composed of a MEMS electrostatic drive type vibrator. At that time, in a case when, for example, the reference signal generator is created by a single MEMS electrostatic drive type vibrator, it is possible for the RC circuit (DC voltage stabilization circuit) 10 for stabilizing the DC voltage which is constituted by the above-mentioned resistor Ra and capacitor Ca to be connected, similarly as shown in FIG. 4 (however, filter is replaced by reference signal generator), between a DC power supply input pad to the reference signal generator, that is, a DC power supply input pad 22 connected to the DC power supply 3 and the beam 7 of the single vibrator 21.

Also, in a case when the reference signal generator is fabricated similarly by a single MEMS electrostatic drive type vibrator, it is possible for the RC circuit (DC voltage stabilization circuit) 10 for stabilizing the DC voltage which is constituted by the above-mentioned resistor Ra and capacitor Ca to be connected, similarly as shown in FIG. 5 (however, filter is replaced by reference signal generator), between a DC power supply input pad to the reference signal generator, that is, a DC power supply input pad 22 connected to the DC power supply 3 and the input electrode 5 of the single vibrator 21.

Also, in a case when, for example, the reference signal generator is fabricated by a plurality of MEMS electrostatic drive type vibrators in which the beams are parallelized, it is possible for the RC circuit (DC voltage stabilization circuit) 10 for stabilizing the DC voltage which is constituted by the above-mentioned resistor Ra and capacitor Ca to be connected, similarly as shown in FIG. 6 (however, filter is replaced by reference signal generator), between a DC power supply input pad to the reference signal generator, that is, a DC power supply input pad 22 connected to the DC power supply 3 and the plurality of vibrators 23, that is, the parallelized beams 7.

Also, in a case when the reference signal generator is fabricated similarly by a plurality of MEMS electrostatic drive type vibrators in which the vibration electrodes are parallelized, it is possible for the RC circuit (DC voltage stabilization circuit) 10 for stabilizing the DC voltage which is constituted by the above-mentioned resistor Ra and capacitor Ca to be connected, similarly as shown in FIG. 7 (however, filter is replaced by reference signal generator), between a DC power supply input pad to the reference signal generator, that is, a DC power supply input pad 22 connected to the DC power supply 3 and the plurality of vibrators 23, that is, the input electrode 5 thereof.

The RC circuit (DC voltage stabilization circuit) 10 for stabilizing the DC voltage mentioned above can be formed on a same substrate together with the reference signal generator.

Although not shown, it is also possible to form the above-mentioned RC circuit (DC voltage stabilization circuit) 10 as a portion of a transmission line which is formed between the DC power supply input pad 22 to the reference signal generator and the DC power supply 3 for driving the MEMS electrostatic drive type vibrator of the reference signal generator.

Figure 8A:
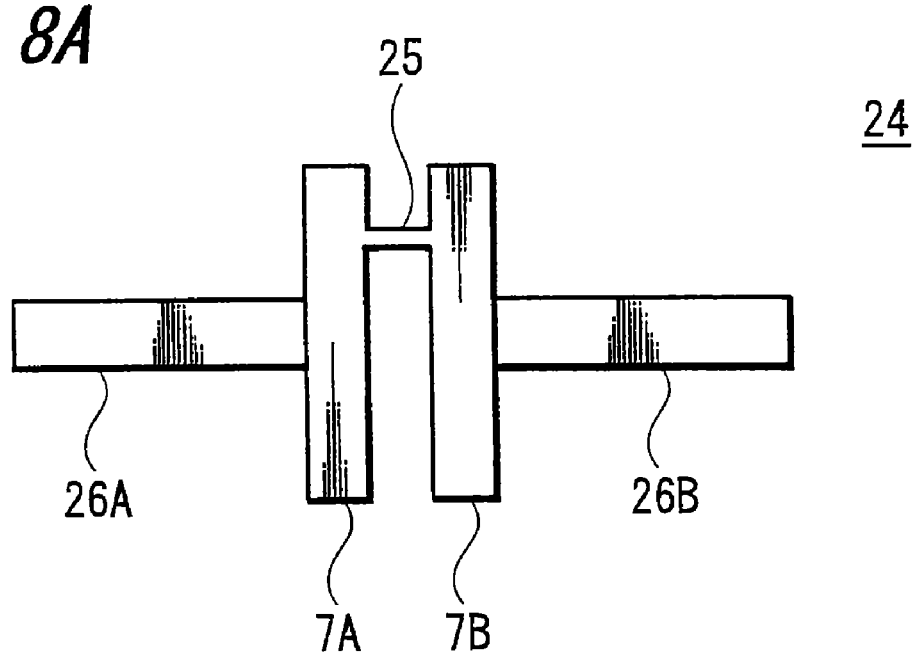
FIGS. 8A and 8B are a plan view and a cross sectional view showing a compound vibrator constituting a compound vibrator type filter applied to the present invention.
Figure 8B:
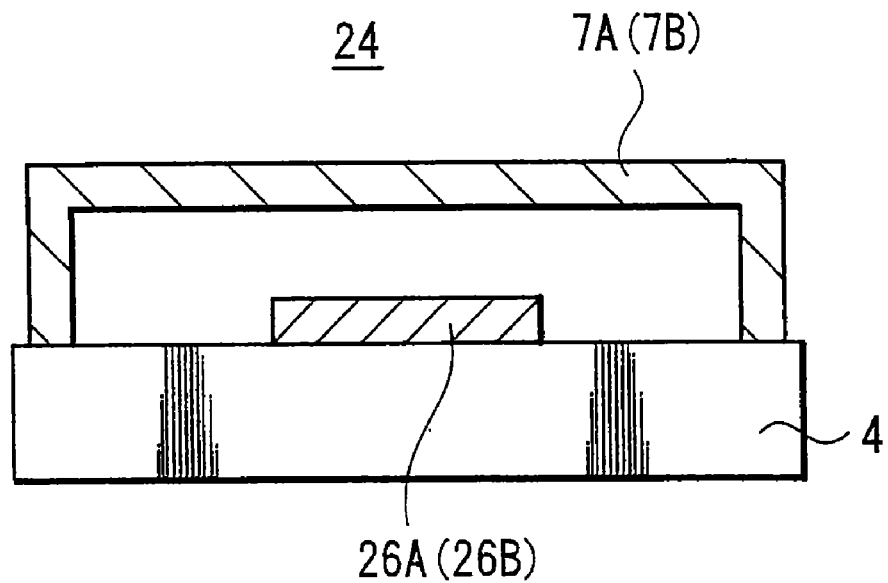

It is possible for the high frequency signal device relating to this exemplified embodiment to be formed by a compound vibrator type filter which is formed by a MEMS electrostatic drive type vibrator and is constituted by a mechanical coupling. There is shown in FIG. 8 an outline constitution of the compound vibrator constituting this compound vibrator type filter. This compound vibrator 24 is constituted by arranging two of the beams 7 [7A and 7B] parallelly, linking portions of the two of the beams 7A and 7B mechanically by a coupling portion 25, arranging an input electrode 26A composed of a lower electrode 26 on a lower side of the one beam 7A and arranging an output electrode 26B composed of the lower electrode 26 on a lower side of the other beam 7B. The position of the coupling portion 25 is selected to be at a vibration node (fixed point). In this case, the DC bias voltage is applied to the beams 7 [7A and 7B].

Figure 9:
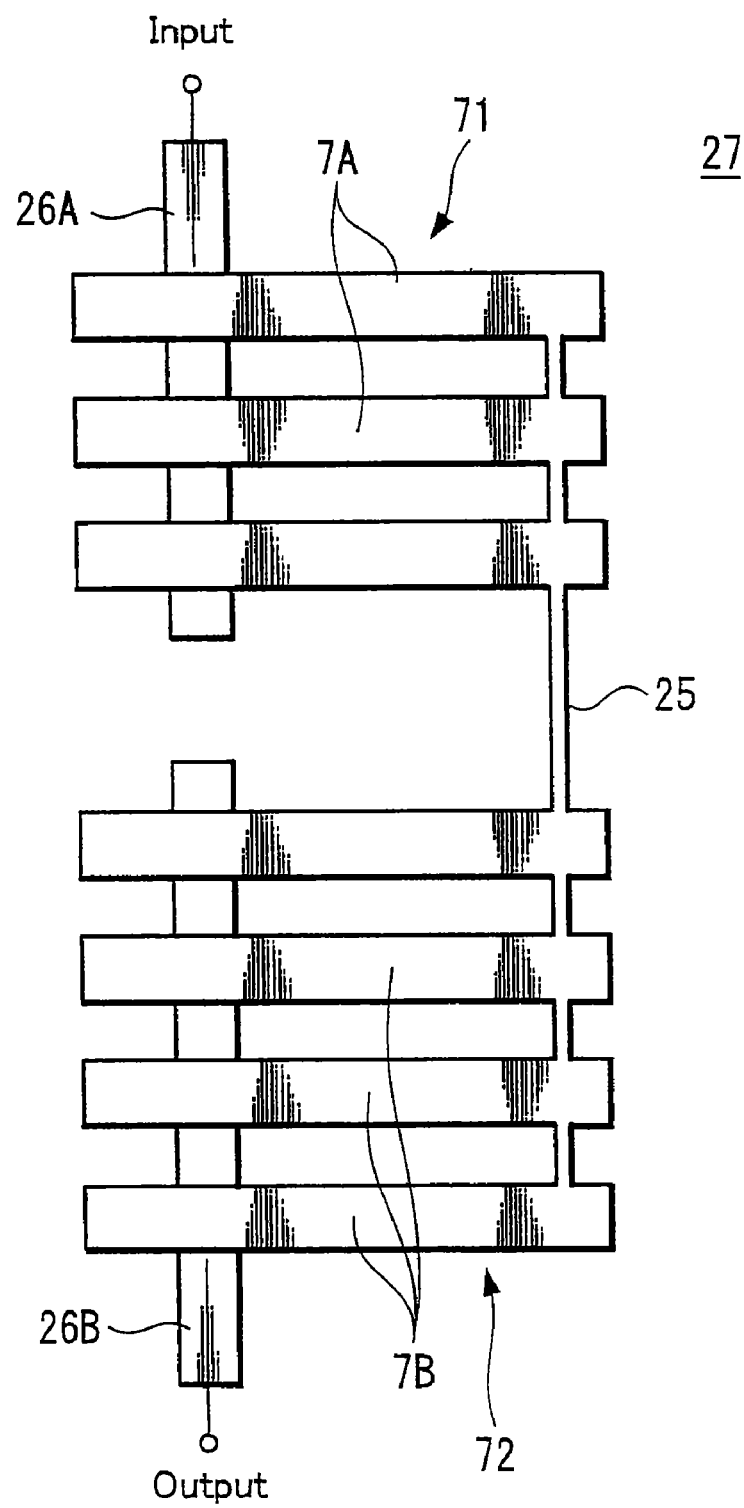
FIG. 9 is a plan view showing a parallelized compound vibrator constituting a compound vibrator type filter applied to the present invention.

It is also possible to constitute such that a plurality of such compound vibrators 24 are parallelized so as to carry out filtering the high frequency signal in parallel. For example, a compound vibrator 27 is constituted, as shown in FIG. 9, by arranging an input electrode 26A composed of one lower electrode with respect to a beam group 71 composed of one plurality of parallel beams 7A, arranging an output electrode 26B composed of one lower electrode with respect to a beam group 72 composed of the other plurality of parallel beams 7B so as to be in parallel with the beam group 71 and linking both of the beam groups 71 and 72 by a coupling portion 25.

At that time, in a case when, for example, the compound vibrator type filter is created by a single compound vibrator 24 (see FIG. 8), it is possible for the RC circuit (DC voltage stabilization circuit) 10 for stabilizing the DC voltage which is constituted by the above-mentioned resistor Ra and capacitor Ca to be connected, similarly as shown in FIG. 4 (however, filter is replaced by compound vibrator type filter), between a DC power supply input pad to the compound vibrator type filter, that is, a DC power supply input pad 22 connected to the DC power supply 3 and the beams 7 [7A and 7B] of the single compound vibrator 24.

Also, in a case when, for example, the compound vibrator type filter is fabricated by a plurality of parallelized compound vibrators 27 (see FIG. 9), it is possible for the RC circuit (DC voltage stabilization circuit) 10 for stabilizing the DC voltage which is constituted by the above-mentioned resistor Ra and capacitor Ca to be connected, similarly as shown in FIG. 4 (however, filter is replaced by compound vibrator type filter), between a DC power supply input pad to the compound vibrator type filter, that is, a DC power supply input pad 22 connected to the DC power supply 3 and the plurality of parallelized compound vibrators 27, that is, the parallelized beams 71 and 72.

Further, although not shown, it is also possible to form the above-mentioned RC circuit (DC voltage stabilization circuit) 10 as a portion of a transmission line which is formed between the DC power supply input pad 22 to the compound vibrator type filter and the DC power supply 3 for driving the compound vibrator 24 or 27 of the compound vibrator type filter.

Then, the RC circuit (DC voltage stabilization circuit) 10 for stabilizing the DC voltage mentioned above can be formed on a same substrate together with the compound vibrator type filter.

It should be noted in the compound vibrator 24 or the compound vibrator 27 that it is also possible, as shown in FIG. 5, to connect the DC voltage stabilization circuit 10 between the vibrator input electrode 26A and the DC power supply input pad 22.

It is possible to form the high frequency signal device and the DC voltage supply means for supplying the DC bias voltage, for example, an RC circuit on a same substrate (in the same die). It is also possible to form the high frequency signal device and the DC voltage supply means for supplying the DC bias voltage on substrates different from each other and to form the both sides thereof to be connected.

Figure 10:
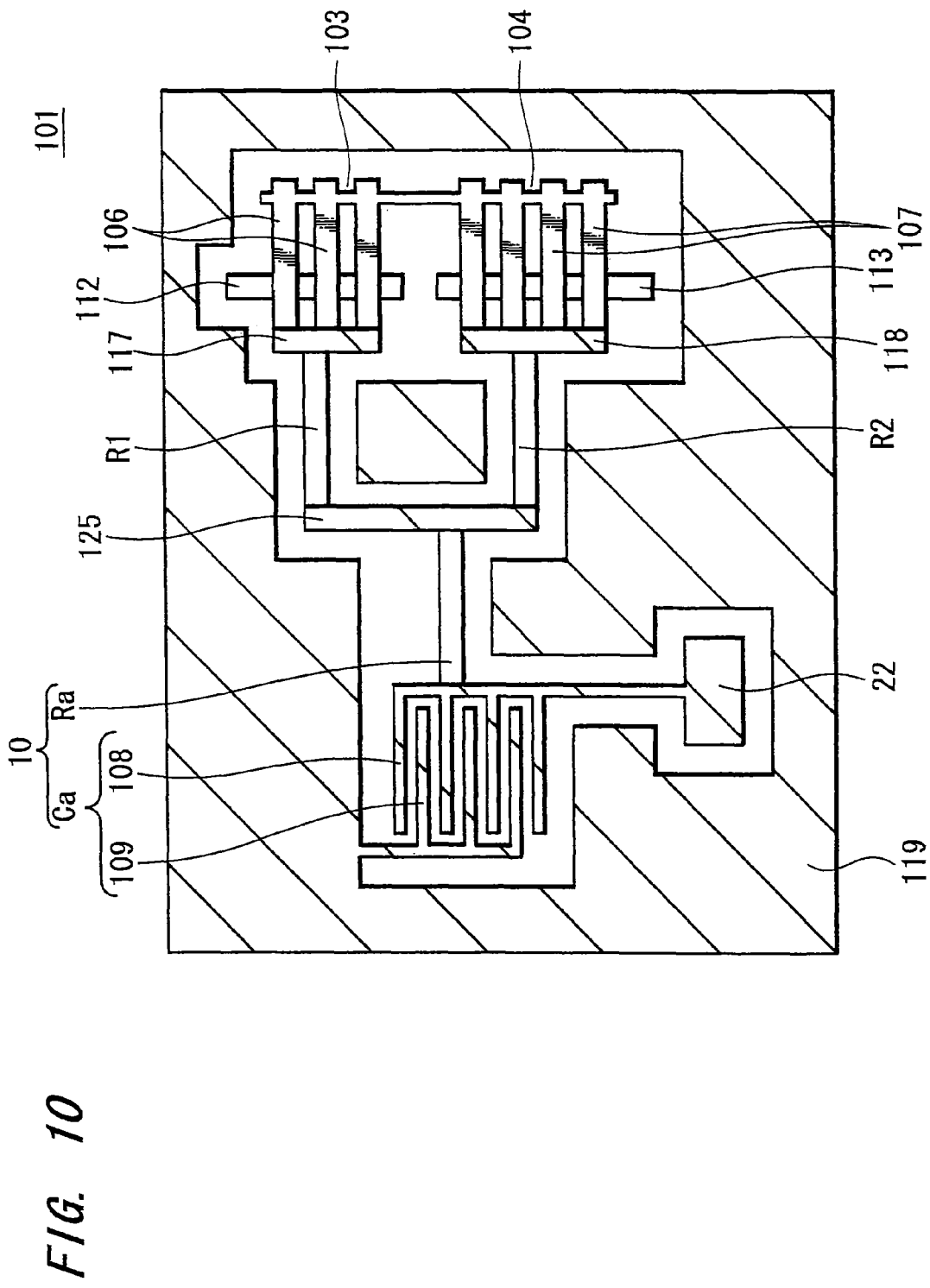
FIG. 10 is a plan view showing a first exemplified embodiment of a high frequency device relating to the present invention.
Figure 11:
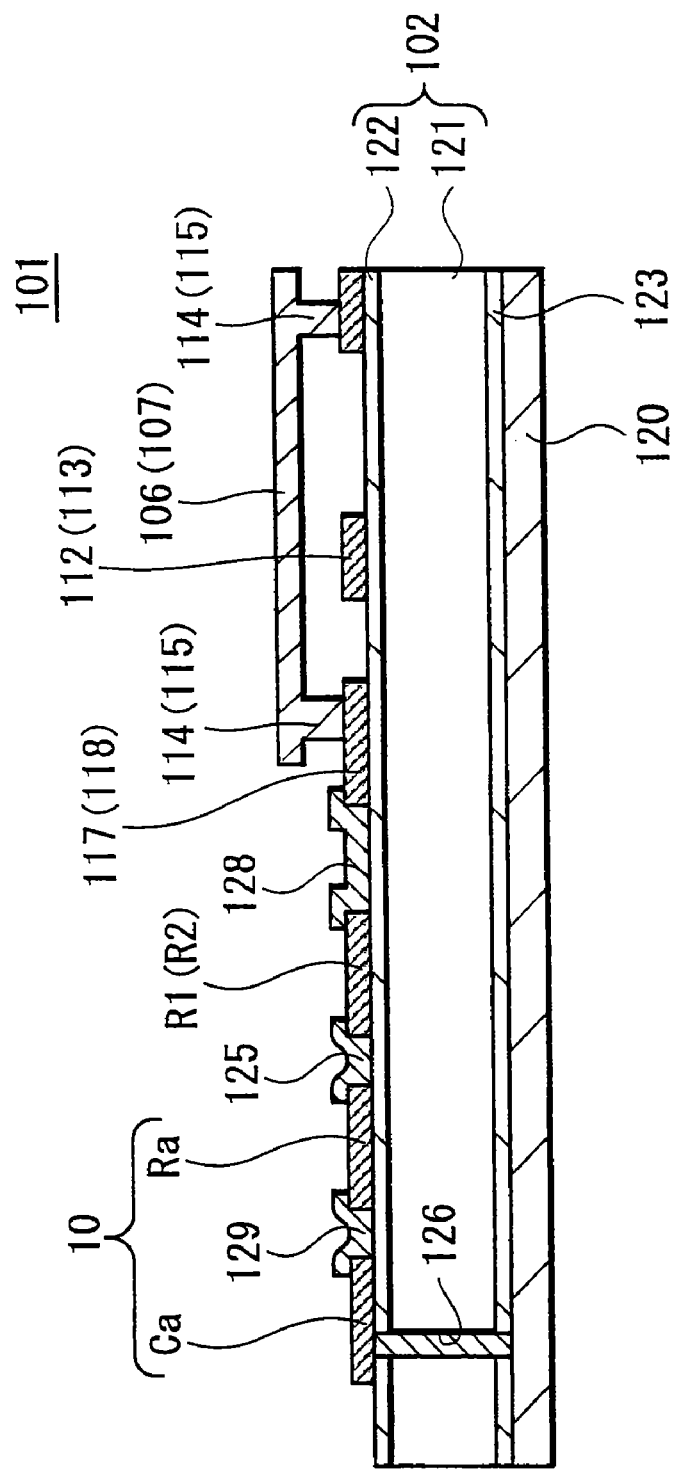
FIG. 11 is a cross sectional view showing the first exemplified embodiment of a high frequency device relating to the present invention.

Next, there is shown in FIG. 10 (plan view) and FIG. 11 (frame format like cross sectional view) a first exemplified embodiment of a high frequency device relating to the present invention. This example is a case which is applied with a compound vibrator type filter constituted by coupling MEMS electrostatic drive type vibrators mechanically.

A compound vibrator type filter 101 relating to this exemplified embodiment is formed by being provided with a plurality of compound vibrators 103 and 104 on a common substrate 102, resistors R1 and R2 for preventing high frequency (RF) signal leakage between beams 106 and 107 of the vibrator 103 and 104, a DC voltage stabilization circuit (so-called, RC circuit) 10 composed of a resistor Ra and a capacitor Ca which is formed by arranging a pair of sawtooth type electrodes 108 and 109 being apart from each other by a necessary distance and an electrode pad for the DC power supply, so-called, a DC power supply input pad 22.

For the substrate 102, there is used, for example, a substrate having an insulation layer on a front face of a semiconductor substrate, an insulative substrate or the like in which a substrate having an insulation layer 122 on a front face of a semiconductor substrate 121 is used in this example. There are formed, on the front face of the this substrate 102, lower electrodes, that is, an input electrode 112 and an output electrode 113, a plurality of vibration portions, that is, beams 106 having center impeller beam structures which stride over the input electrode 112 in bridge shape are arranged parallelly and similarly, a plurality (same number or different number as that mentioned above) of vibration portions, that is, beams 107 having center impeller beam structures which stride over the output electrode 113 in bridge shape are arranged parallelly. The plurality of beams 106 which stride over the input electrode 112 are commonly connected to a wiring portion 117 formed on the substrate 102 one another through supporting portions (anchor portions) 114 of the beams 106. In addition, also the plurality of beams 107 which stride over the output electrode 113 are similarly and commonly connected to a wiring portion 118 formed on the substrate 102 one another through supporting portions (anchor portions) 115 of the beams 107. On the front face of the substrate 102, there is formed a conductive layer 119 which becomes a shield electrode (ground) plane so as to surround the compound vibrators 103 and 104, the resistors R1 and R2, the DC voltage stabilization circuit 10 and the DC power supply input pad 22. On the rear face of the substrate 102, there is formed a ground surface, that is, a ground electrode 120 applied with the ground potential through an insulation layer 123.

With respect to the resistors R1 and R2 for preventing RF signal leakage, one terminals thereof are connected to the wiring portions 117 and 118 of the two beam groups 106 and 107 through wiring portions 128 respectively and the other terminals of the resistors R1 and R2 are connected to the wiring portion 125 commonly. On the other hand, one terminal of the resistor Ra which constitutes the DC voltage stabilization circuit 10 is connected to the wiring portion 125 and the other terminal of the resistor Ra is connected to the one sawtooth type electrode 108 which constitutes the capacitor Ca through the wiring portion 129. This one sawtooth type electrode 108 is connected to the DC power supply input pad 22. The other sawtooth type electrode 109 constituting the capacitor Ca is connected to the conductive layer 119 for shielding which is formed on the front face of the substrate 102 and at the same time is connected to the ground electrode 120 on the substrate rear face by passing through, for example, a through-hole provided in the substrate 102 or the substrate side face and by passing through a through-hole 126 according to this example.

According to the compound vibrator type filter 101 relating to this exemplified embodiment mentioned above, a DC bias voltage is apply to the beams 106 and 107 of the vibrators 103 and 104 by way of the DC voltage stabilization circuit 10 composed of the resistor Ra and the capacitor Ca, so that it is possible to repress time fluctuation of the high frequency signal after filtering. Also, it is possible to repress and minimize the damage to the vibrator which is caused by a surge voltage.

The present invention is also applicable to a case in which a semiconductor integrated circuit is constituted by installing a MEMS device such as a high frequency filter in another semiconductor circuit, for example, in a digital circuit and the voltage supply to the MEMS device and the digital circuit is carried out by using a common power supply means.

Next, exemplified embodiments of manufacturing methods of a high frequency device according to the present invention will be explained by using FIG. 12 to FIG. 15. It should be noted that manufacturing processes of FIG. 12 to FIG. 15 show examples of a high frequency device having a DC voltage stabilization circuit 10 composed of a MEMS electrostatic drive type vibrator, resistor Ra and capacitor Ca, but they are also applicable to manufacturing of the compound vibrator type filter 101 mentioned above. The manufacturing processes of this example are equivalent to those which are used in normal MOS fabricating processes.

Figure 12A:
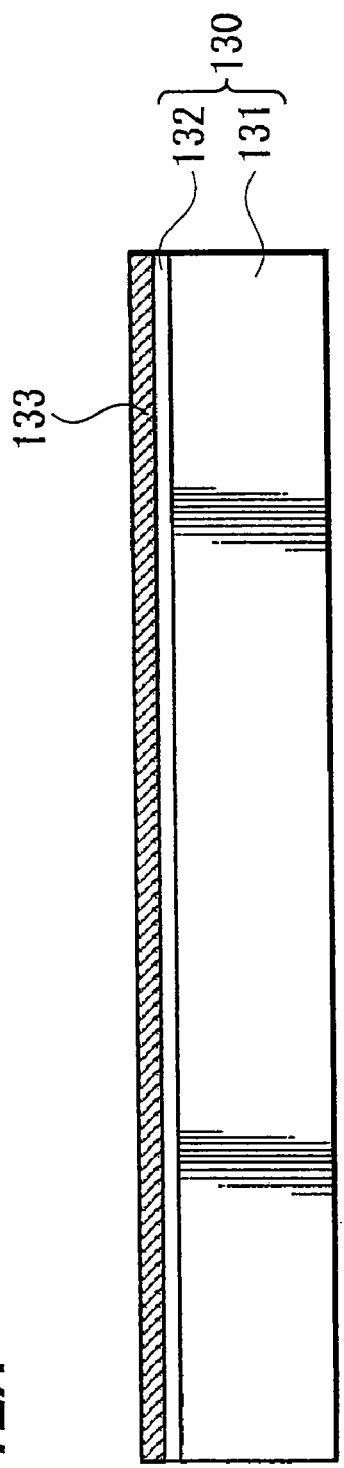
FIGS. 12A and 12B are manufacturing process diagrams (No. 1 thereof) showing one exemplified embodiment of a manufacturing method of a high frequency device relating to the present invention.

First, a substrate 130 is prepared as shown in FIG. 12A. According to example, an insulation layer, for example, a compound insulation layer 132 composed of a silicon oxide thin film (HDP film: High Density Plasma oxide film) and a silicon nitride thin film (upper face side) which becomes an etching prevention film is film-made on a high resistance silicon (Si) wafer 131 by a necessary film thickness, for example, by a film thickness of around 200 nm. Subsequently, a phosphorus doped polycrystalline silicon thin film (PDAS: Phosphorus doped amorphous silicon) 133 having conductivity is film-made on this compound insulation layer 132 by a necessary film thickness, that is, by a film thickness of around 380 nm.

Figure 12B:
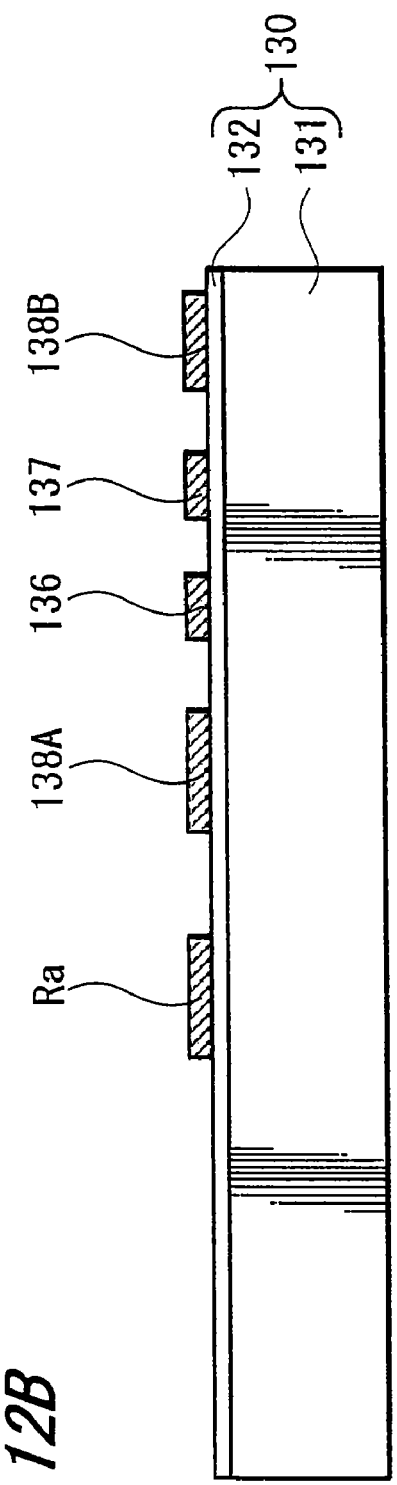

Next, there are formed, on the polycrystalline silicon thin film 133, an input electrode and an output electrode which become lower electrodes of the compound vibrator, a wiring portion (corresponding to fixed table) for connecting a supporting portion of a beam having a center impeller beam structure of the compound vibrator and a resist mask (not shown) having a pattern corresponding to the resistor. Then, as shown in FIG. 12B, the polycrystalline silicon thin film 133 is etching processed selectively through this resist mask by means of selective etching, for example, by means of dry etching method and an input electrode 136, an output electrode 137, wiring portions 138 [138A and 138B] and the resistor Ra are formed.

Figure 13A:
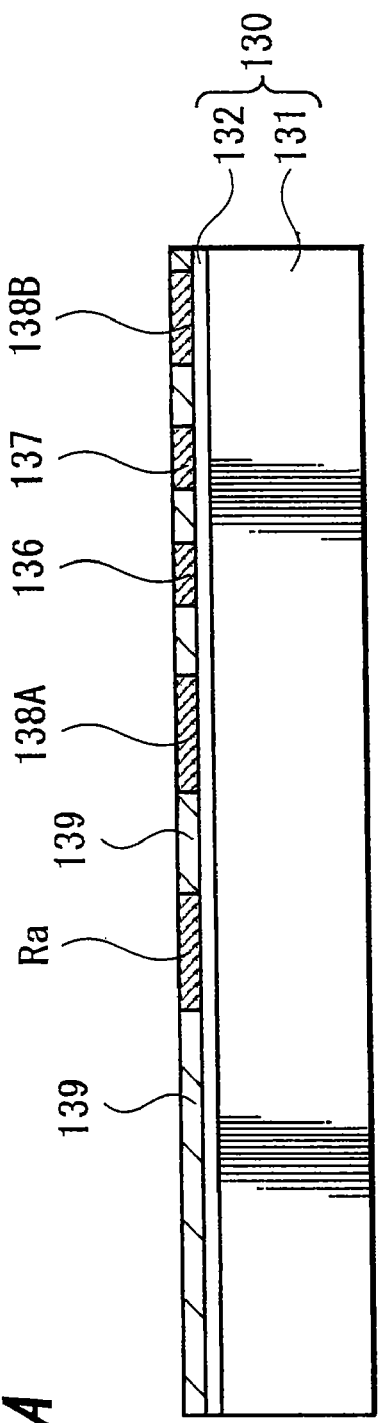
FIGS. 13A and 13B are manufacturing process diagrams (No. 2 thereof) showing one exemplified embodiment of a manufacturing method of a high frequency device relating to the present invention.

Next, as shown in FIG. 13A, for example, a silicon oxide thin film (HDP) 139 which becomes a sacrifice layer is film-made on the substrate 130 and on the whole surface of the substrate such that spacings among the input and output electrodes 136 and 137, the wiring portions 138 [138A and 138B] and the resistor Ra are to be buried. Thereafter, the silicon oxide thin film 139 is planarized. For example, it is planarized by a chemical machinery polishing method (CMP) and front faces of the input/output electrodes 136 and 137, the wiring portions 138 [138A and 138B] and the resistor Ra are to be exposed.

Figure 13B:
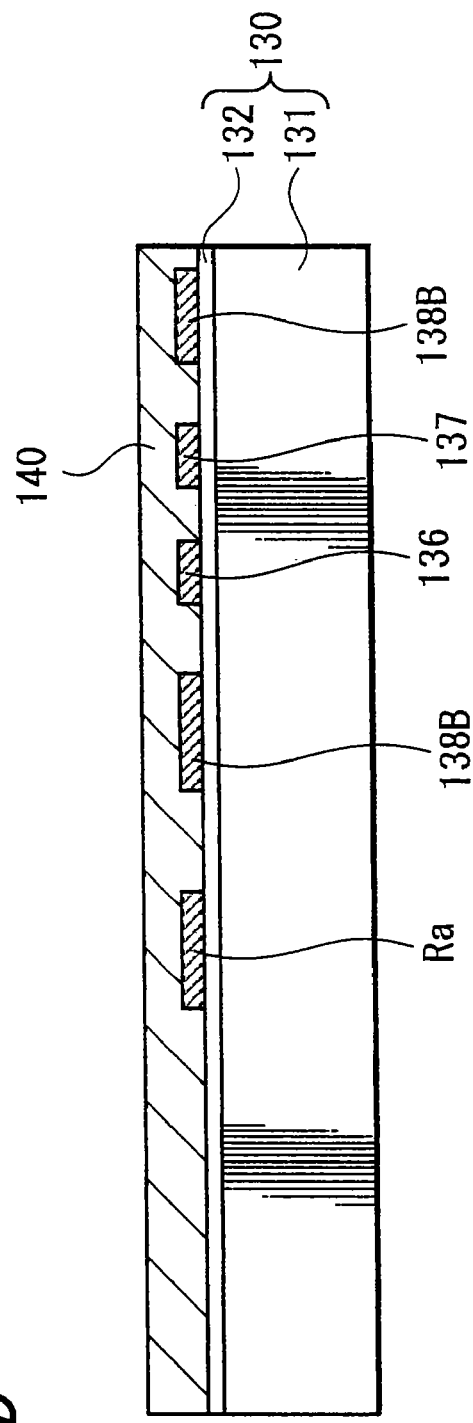

Next, as shown in FIG. 13B, for example, a silicon oxide thin film (low-pressure TEOS) 140 which becomes a sacrifice layer having a film thickness corresponding to a distance between the input/output electrodes 136, 137 and a beam to be formed thereafter, that is, a film thickness of around 50 nm according to this example is formed on the planarized front face.

Next, as shown in FIG. 14A, for example, a phosphorus doped polycrystalline silicon thin film (PDAS film) 141 having a film thickness of around 20 nm is film-made on the silicon oxide thin film (low-pressure TEOS) 140 which becomes a sacrifice layer if necessary and thereafter, through-holes 142 [142A and 142B] for connecting spacings between the beam and the wiring portions 138A, 138B are formed in the polycrystalline silicon thin film 141 and at the same time in the silicon oxide thin film (low-pressure TEOS) 140 by a selective etching, for example, a dry etching method.

Next, as shown in FIG. 14B, a phosphorus doped polycrystalline silicon thin film (PDAS film) having a desired film thickness is formed on the front face including the inside of the through-holes 142A and 142B and is patterning-processed in a beam shape, for example, is patterning-processed by a dry etching method whereby a beam by a polycrystalline silicon thin film, that is, a beam 145 and its supporting portions 146A and 146B are formed. Further, patterning is applied, for example, by a dry etching method and openings 142C and 142D are formed at spacing between the wiring portion 138A and the resistor Ra, at a wiring portion connected to the resistor Ra and a portion of the capacitor Ca. At that time, the supporting portions 146A and 146B of the beam 145 are connected to the wiring portions 138A and 138B mechanical and also electrically.

Figure 15:
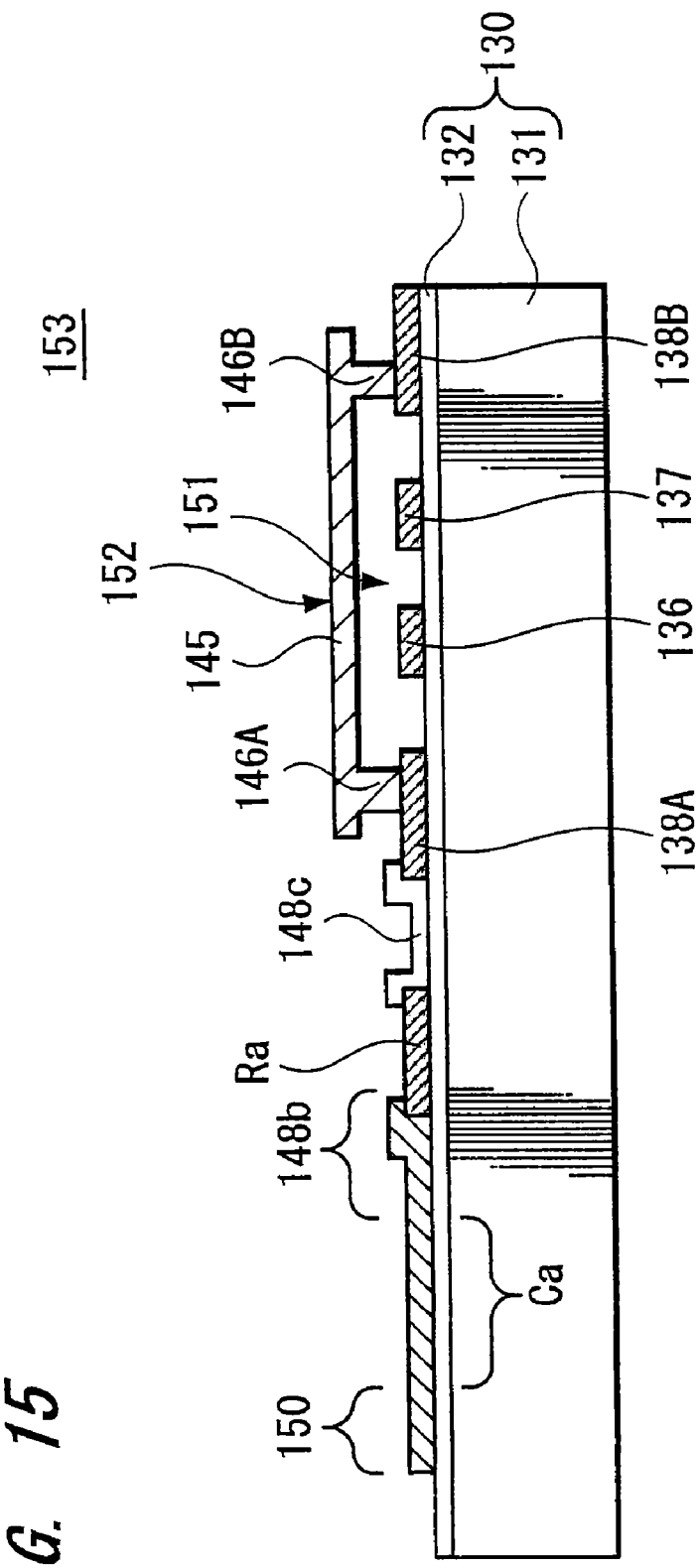
FIG. 15 is a manufacturing process diagram (No. 4 thereof) showing one exemplified embodiment of a manufacturing method of a high frequency device relating to the present invention.

Next, as shown in FIG. 15, a thin film, for example, an Al—Si film which becomes connection wirings, a capacitor and a DC power supply input pad is film-made, patterning is applied by using a resist mask and a hydrogen fluoride solution (DHF: Diluted HF) and a capacitor Ca, connection wirings 148 and a DC power supply input pad 150 by means of the Al—Si film are formed. More specifically, a connection wiring 148a between the wiring portion 138A and the resistor Ra, a pair of sawtooth type electrodes constituting the capacitor Ca, an electrode pad 150 connected to one of the sawtooth type electrodes and a connection wiring 148b between the one of the sawtooth type electrodes and the resistor Ra are formed.

At the same time, the silicon oxide thin film (HDP) 140 which becomes a sacrifice layer is removed by this hydrogen fluoride solution (DHF) and a space 151 is formed between the beam 145 and the input and output electrodes 136, 137. Thereby, there is obtained an aimed high frequency device 153 in which a MEMS electrostatic drive type vibrator 152, the DC voltage stabilization circuit 10 and the DC power supply input pad 150 are formed on a same substrate 130 (see FIG. 15).

Next, it will be explained with respect to another exemplified embodiment of a high frequency device relating to the present invention in which signal leakage bypassing the circuits other than the signal path is repressed when handling a weak signal of a high frequency range and improvement of signal to noise ratio of the high frequency signal and improvement of the above-mentioned DC bias voltage stability are attempted.

As a high frequency device for repressing the signal leakage, there is included a high frequency signal device operated by being applied with a DC bias voltage to a portion of the high frequency signal line and impedance mismatching is employed between the impedance of the high frequency signal line and the impedance of the DC supply wiring supplying the DC bias voltage.

Also, as a high frequency device for repressing the signal leakage, there are included a high frequency signal device operated by being applied with the DC bias voltage to a portion of the high frequency signal line and DC voltage supply means for driving the high frequency signal device, and the impedance of another wiring connected to the high frequency signal line is made to be mismatching with respect to the impedance of the high frequency signal line.

According to an embodiment of a high frequency device for repressing the signal leakage, in a case when a DC bias voltage is supplied to one or a plurality of high frequency blocks (for example, parallel vibrators), the high frequency circuit blocks are properly divided and there are connected there-between by impedances different from the impedance of an RF signal line seen from the DC supply portion which forms a portion of the RF signal line within the high frequency circuit block. If the DC supply wiring is formed by using such a connection method, it is possible to repress the leakage from the signal line on which the DC bias voltage and the high frequency signal are applied by being mixed within the high frequency circuit block with respect to the outside of the block through the DC feeding circuit at the minimum. The best connection method lies in connecting the DC supply wiring through a low-pass filter, but it is possible to obtain an adequate effect according to only the difference of resistors. In particular, in a case when a high frequency device is constituted by using a MEMS (Micro Electro Mechanical System) electrostatic drive type (beam type) vibrator group, the impedance of the MEMS vibrator for direct current is significantly large and only a significantly little DC current flows in the DC feed line, so that the voltage drop by the resistor does not occur even if rather a large resistor, for example, a few M$\Omega$s of resistor is inserted between the vibrator group and the DC supply wiring and consequently, effective impedance mismatching can be realized.

This exemplified embodiment further makes it possible to carry out a stable supply of the DC bias voltage to the vibrator with respect to the high frequency device in which the leakage is repressed by such impedance mismatching.

Figure 16:
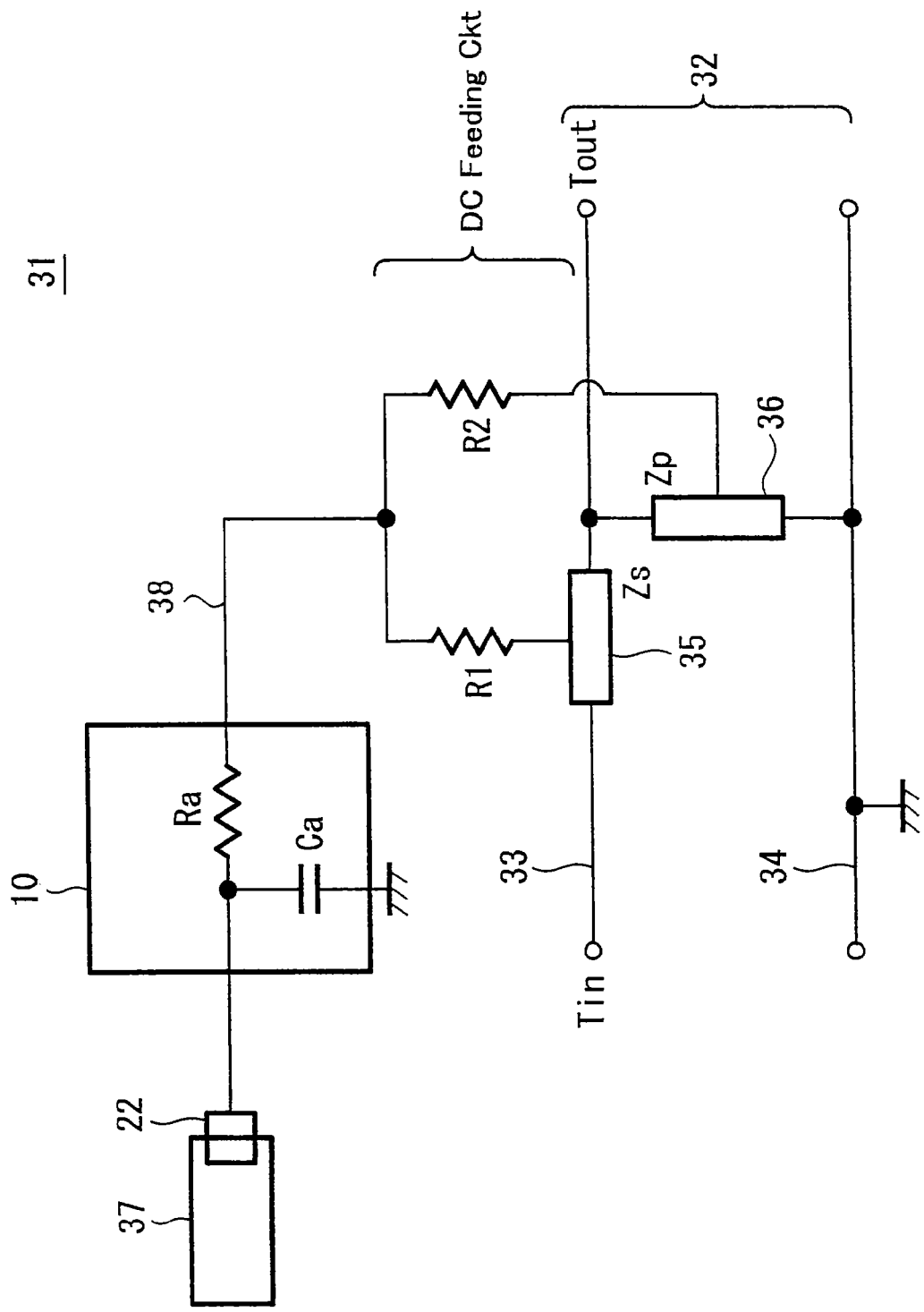
FIG. 16 is an equivalent circuit diagram showing a second exemplified embodiment in which a high frequency device relating to the present invention is applied to a ladder type filter of one stage constitution.

FIG. 16 is an equivalent circuit of a second exemplified embodiment in which a high frequency device relating to the present invention is applied to a ladder type filter of one stage constitution.

With respect to the ladder type filter 31 of this exemplified embodiment, the high frequency signal line 32 is constituted by a microstrip transmission line, a vibrator 35 constituted by a plurality of parallelized vibrators (vibrator group) is connected serially between an input terminal Tin and a terminal Tout of a signal line 33 thereof and there is similarly connected a shunt vibrator 36 constituted by a plurality of parallelized vibrators (vibrator group) between the output side of this series vibrator 35 and a ground line 34. It is constituted such that this series vibrator 35 and the shunt vibrator 36 are operated by the supply of the DC bias voltage. Accordingly, DC voltage supply means, for example, a DC feeding circuit having a DC power supply circuit 37 and a DC feed line 38 is provided and is connected to a drive portion which becomes a portion of the signal line 33, which is to be described hereinafter, of the series vibrator 35 and the shunt vibrator 36 from the DC power supply circuit 37 through a DC feeding circuit, that is, a DC supply wiring 38. For the DC power supply circuit 37, it is possible to employ a circuit constitution in which, for example, the supply is achieved by converting from an alternate current to a constant voltage and direct current or a circuit constitution in which the supply is achieved by converting from a direct current to a voltage-converted constant voltage and DC voltage.

Then, it is constituted such that there exists impedance mismatching between the impedance seen from the DC supply terminal side of the signal line 33 in this series vibrator 35 and the shunt vibrator 36 and the impedance of the DC supply wiring 38. More specifically, a device for forming the impedance mismatching is connected between the signal line 33 in the series vibrator 35 and the shunt vibrator 36 and the DC supply wiring 38. For this device, this example, the resistor devices R1 and R2 are used. In this example, the resistor device R1 is connected between the beam of the series vibrator 35 and the DC supply wiring 38, and the resistor device R2 is connected between the beam of the shunt vibrator 36 and the DC supply wiring 38. Further, the DC voltage stabilization circuit 10 composed of the resistor Ra and the capacitor Ca is connected between this DC supply wiring 38 and the DC power supply input pad 22 connected to the DC power supply circuit 37. In this case, it is also possible to form the DC voltage stabilization circuit 10 according to the resistors R1 and R2 and the capacitor Ca by eliminating the resistor Ra and by commonly using the resistors R1 and R2.

With respect to the series vibrator 35 and the shunt vibrator 36, they are formed by MEMS electrostatic drive type vibrators. This MEMS electrostatic drive type vibrator has a constitution similar as that in FIG. 1 and FIG. 2 mentioned above, that is, a structure of the vibrator itself excluding the circuit system therein.

The series vibrator 35 in FIG. 16 is constituted by parallelizing this individual MEMS electrostatic drive type vibrator 2 by a plurality of pieces, for example, 40 pieces. The shunt vibrator 36 is constituted by parallelizing the MEMS electrostatic drive type vibrator 2 by a plurality of pieces, for example, 160 pieces. The compound impedance Zs of the series vibrator 35 is composed, for example, of a series resistor Rx=5 k$\Omega$ and a ground capacitor C0=1×10$^{-13}$F. The compound impedance Zp of the shunt vibrator 36 is composed, for example, of a series resistor Rx=1 k$\Omega$ and a ground capacitor C0=8×10$^{-13}$F. The aforesaid resistor devices R1 and R2 connected between the beam which forms a portion of the signal line 33 and the DC feed line 38 are formed, for example, by using a thin line according to a polycrystalline silicon film and it is possible to make the resistance value thereof to be, for example, R1 (R2)=1M$\Omega$. The characteristic impedance of the signal line 33 shown in FIG. 16 is designed to be the same as the compound impedance Zp of the shunt vibrator 36.

The one-stage ladder type high frequency filter 31 of the second exemplified embodiment is constituted by forming the high frequency circuit block composed of the series vibrator 35 and the shunt vibrator 36, the DC power supply circuit 37 and the DC supply block including the DC voltage stabilization circuit 10 and the DC supply wiring 38 on a same semiconductor chip.

FIG. 17 to FIG. 20 show filter characteristic of the ladder type filter of one stage constitution 31 designated by the equivalent circuit of FIG. 16. More specifically, there is shown frequency dependence property of a permeability characteristic value S21 (S parameter) in which the ladder type filter 31 constituted by using a MEMS electrostatic drive type vibrator group which was fabricated by a silicon semiconductor process is measured by using a network-analyzer 3767G manufactured by Advantec Co., Ltd. The series vibrator (vibrator group) 35 and the shunt vibrator (vibrator group) 36 were applied with DC-15V by using a common power supply. The measurement was achieved by setting the resonant frequency of the series vibrator (vibrator group) 35 to be 98 MHz and the center frequency of the shunt vibrator (vibrator group) 36 to be lower than that of the series vibrator by 2 MHz, 3 MHz and 6 MHz, that is, to be 96 MHz, 95 MHz and 92 MHz respectively.

Figure 17:
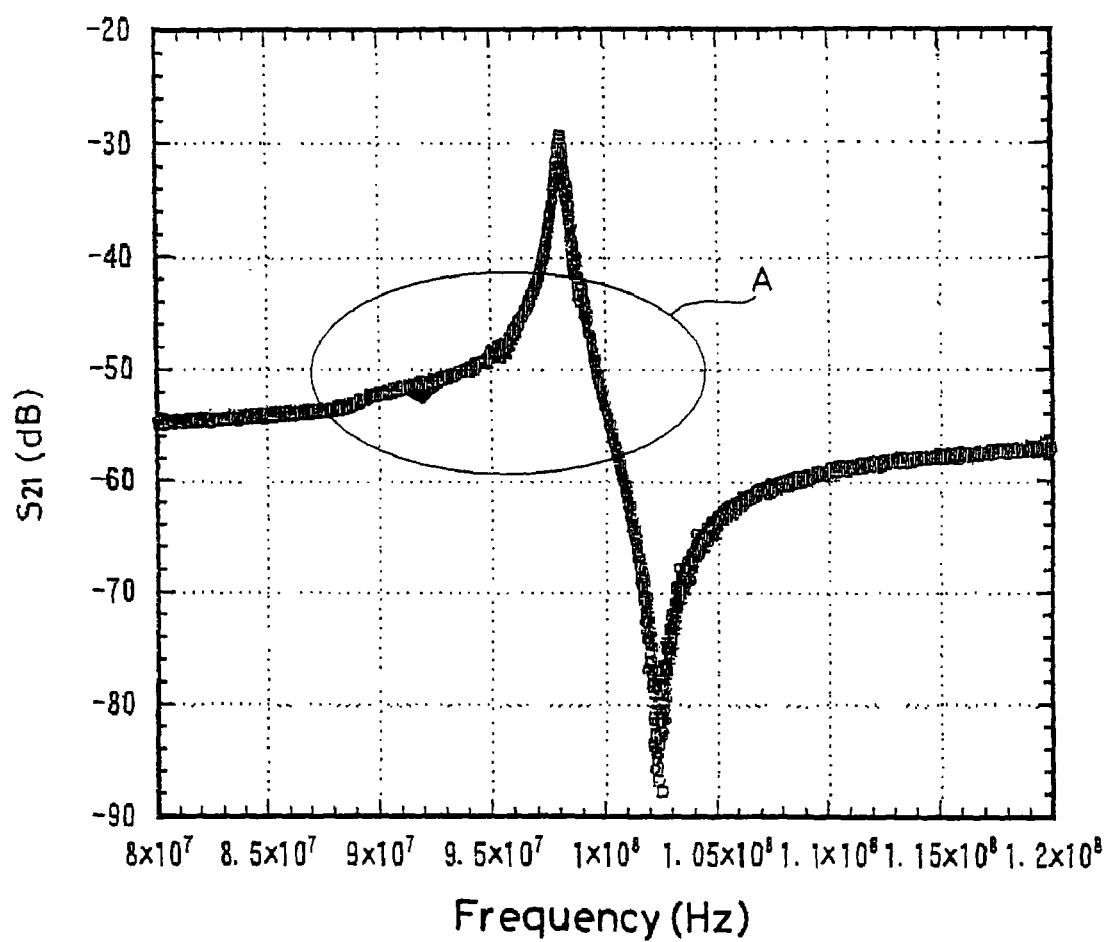
FIG. 17 is a filter characteristic diagram showing frequency dependence property of permeability characteristic value of the ladder type filter of one stage constitution in FIG. 16.
Figure 18:
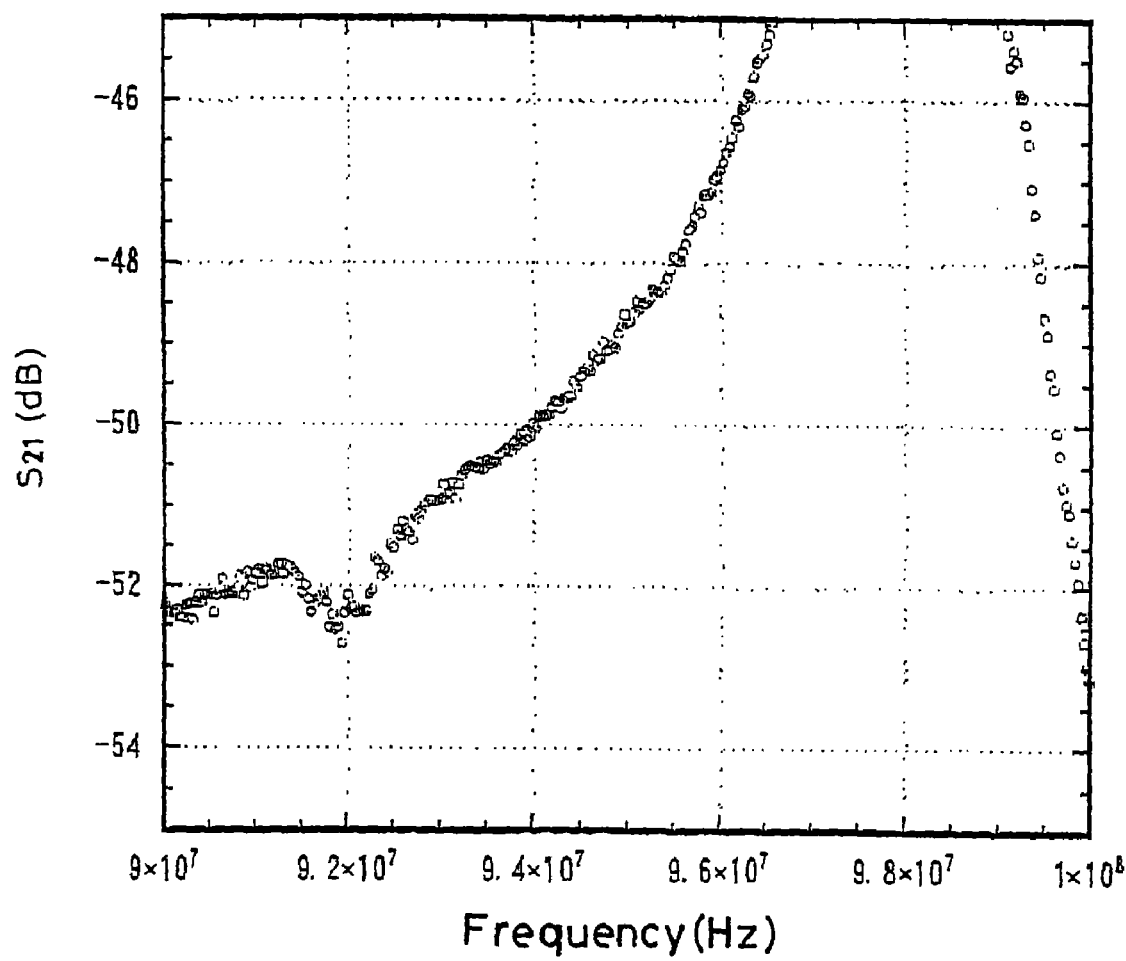
FIG. 18 is an enlarged diagram of a main portion in FIG. 17 when center frequency of a shunt vibrator group in the equivalent circuit of FIG. 16 is made to be 92 MHz.
Figure 19:
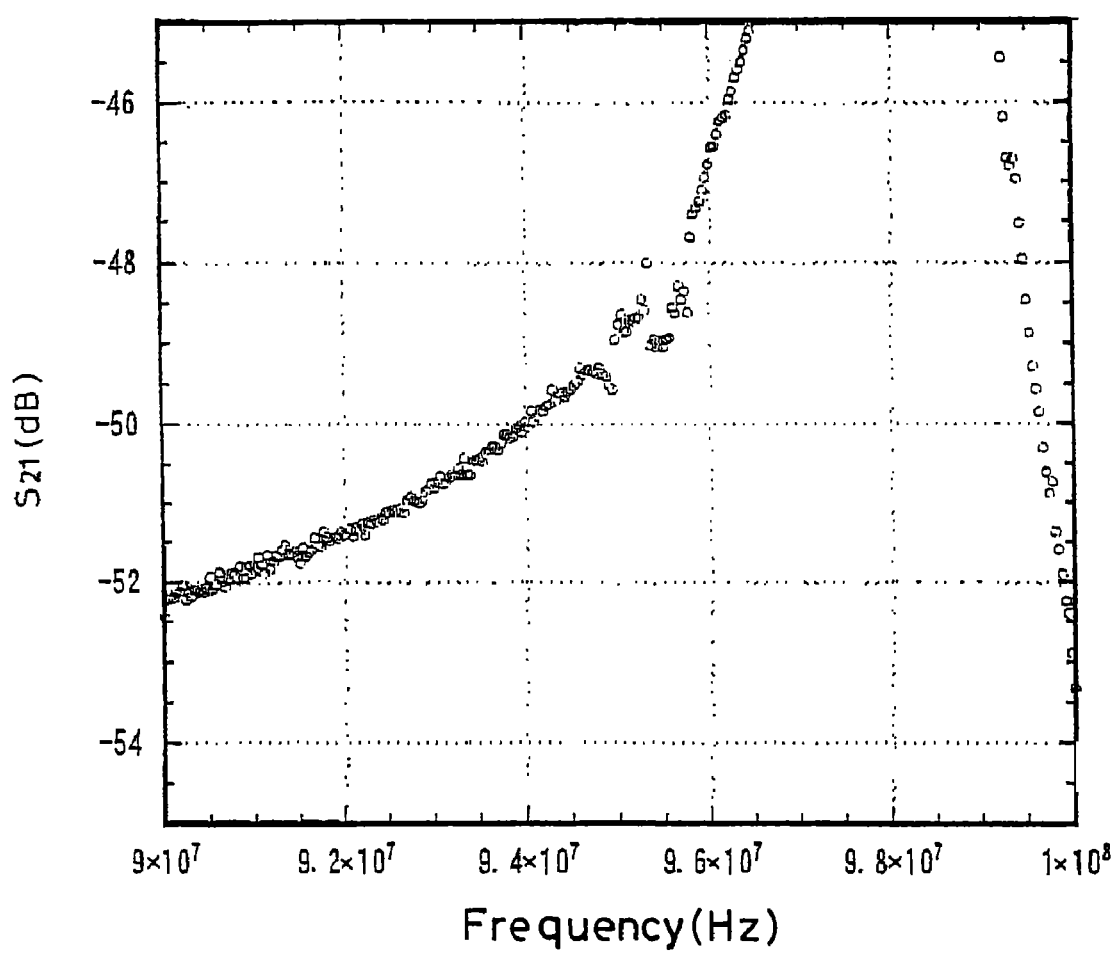
FIG. 19 is an enlarged diagram of a main portion in FIG. 17 when center frequency of a shunt vibrator group in the equivalent circuit of FIG. 16 is made to be 95 MHz.
Figure 20:
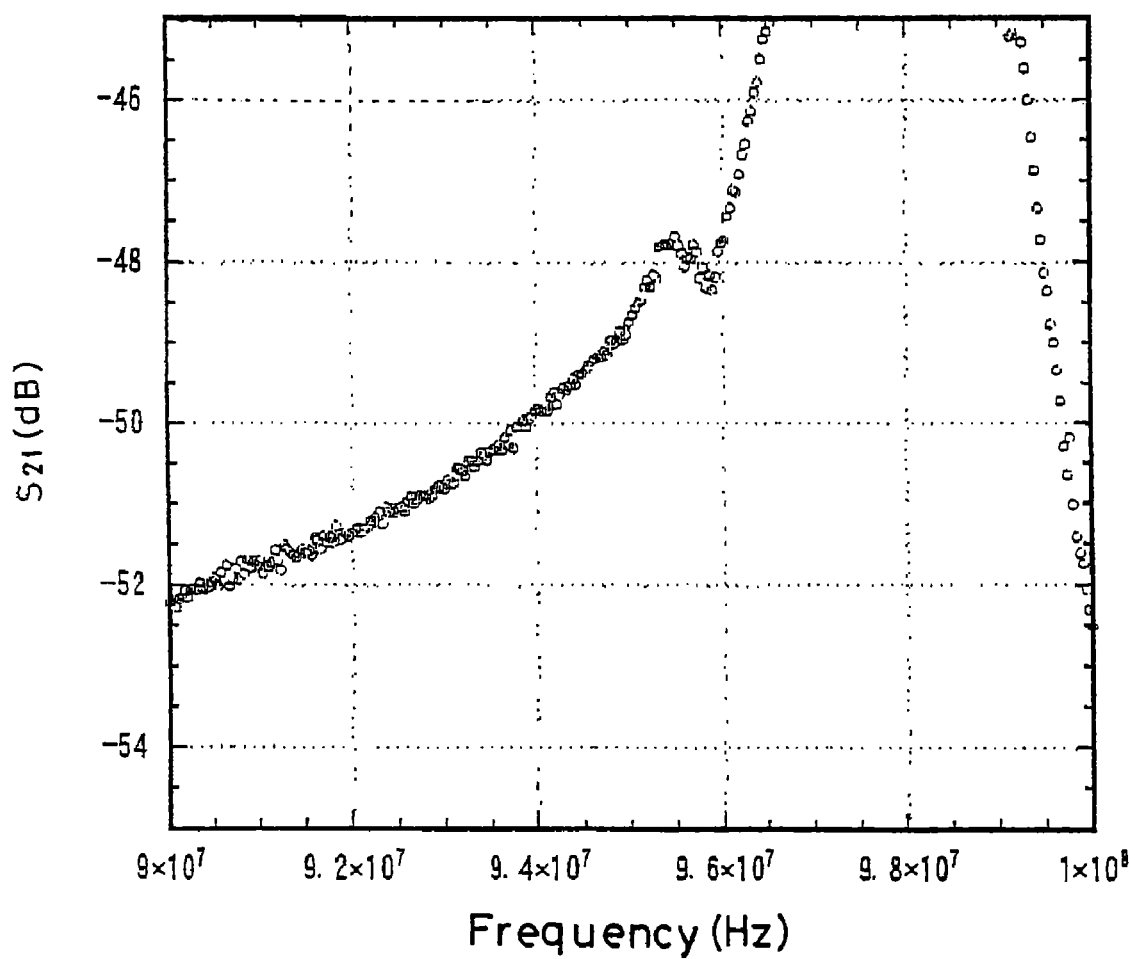
FIG. 20 is an enlarged diagram of a main portion in FIG. 17 when center frequency of a shunt vibrator group in the equivalent circuit of FIG. 16 is made to be 96 MHz.

FIG. 17 is a filter characteristic showing shunt frequency dependence property (characteristic overlapping curved lines in which respective shunt frequencies are different as shown in FIG. 18 to FIG. 20). FIG. 18, FIG. 19 and FIG. 20 show enlarged frequency characteristics corresponding to a main portion A of FIG. 17 when the center frequencies of the shunt vibrator 36 are made to be 96 MHz, 95 MHz and 92 MHz respectively. As being clear from FIG. 17, approximately the same curved line without ghost (noise) is presented for any one of the shunt frequencies and, in particular, the same curved lines are obtained for the peak portions of resonance and anti-resonance in which frequency characteristics without noises are shown as expected. The effect of the shunt vibrator 36 is observed only in an unclear state and this is because the input impedance of the network-analyzer is 50Ω.

According to the ladder type filter of one stage constitution 31 of the second exemplified embodiment, bypassing of the high frequency signal through the DC supply wiring 38 is repressed by connecting the resistor devices R1 and R2 which achieve impedance mismatching between the beam forming a portion of the signal line 33 of the series vibrator 35 and the shunt vibrator 36 which are formed by MEMS electrostatic drive type vibrators and the DC supply wiring 38, and it is possible to improve signal to noise ratio of the high frequency signal for which filtering is performed. Also, there are not required a plurality of independent power supplies, so that it is possible to save the cost relating to the power supply.

In addition, the DC bias voltage is applied to the series vibrator 35 and the shunt vibrator 36 through the DC voltage stabilization circuit 10, so that it is possible to suppress time fluctuation of the high frequency signal which was applied with filtering. Also, it is possible to repress damage to the series vibrator 35 and the shunt vibrator 36 caused by the surge voltage to the minimum.

Figure 21:
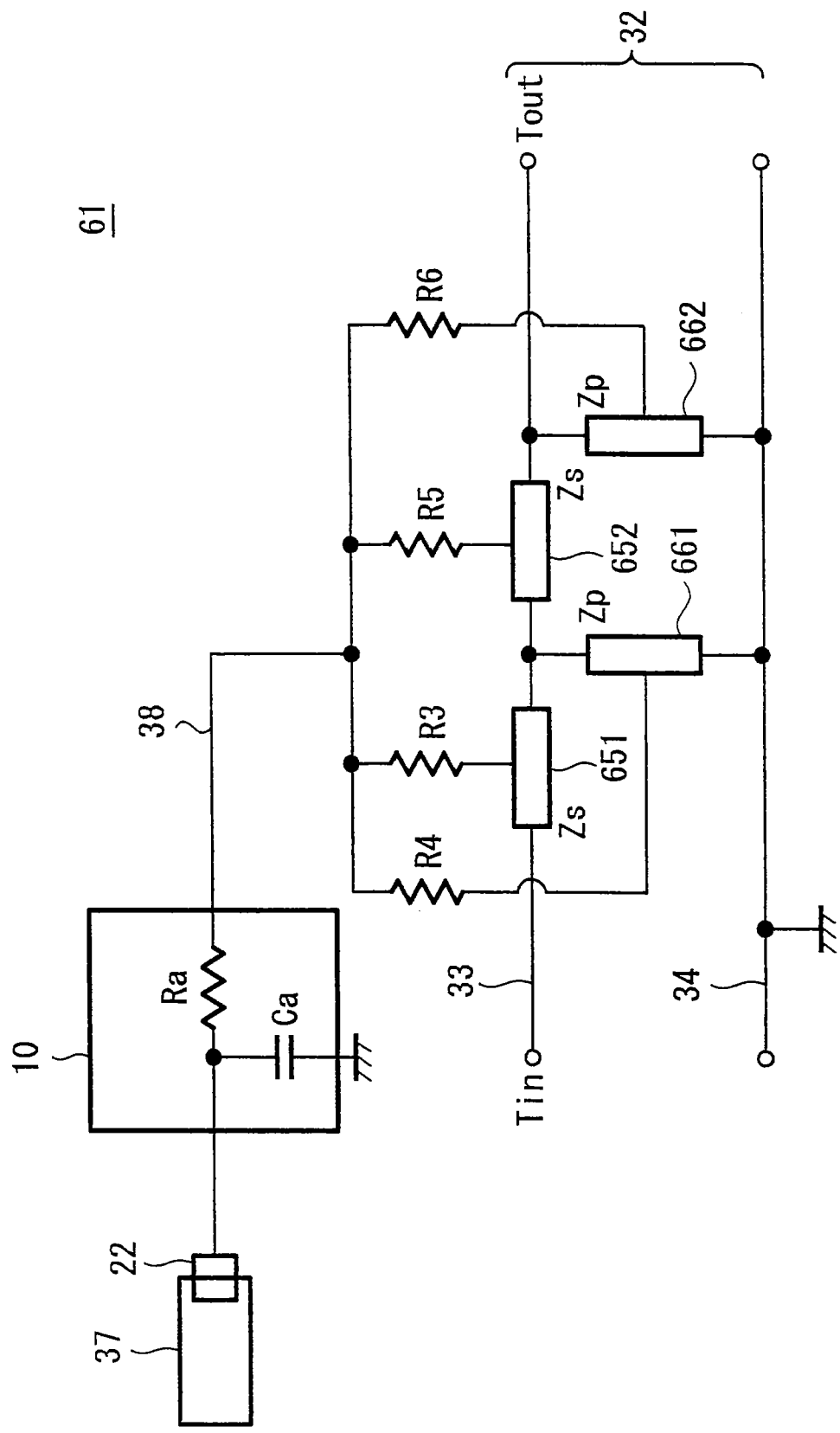
FIG. 21 is an equivalent circuit diagram showing a third exemplified embodiment in which a high frequency device relating to the present invention is applied to a ladder type filter of two stage constitution.

FIG. 21 is an equivalent circuit of a third exemplified embodiment in which a high frequency device relating to the present invention is applied to a ladder type filter of two stage constitution.

A ladder type filter 61 of the third exemplified embodiment is formed by connecting two stages of ladder type filters which are composed of series vibrators 651 and 652 constituted by a plurality of vibrators (vibrator group) parallelized respectively and shunt vibrators 661 and 662 constituted by a plurality of vibrators (vibrator group) parallelized respectively with respect to the high frequency signal line 32 constituted by a microstrip transmission line similarly as mentioned above. More specifically, the series vibrator 651 is connected between the input terminal Tin and the output terminal Tout of the signal line 33, the ladder type filter of the first stage in which the shunt vibrator 661 is connected between the output side of the series vibrator 651 and the ground line 34 is provided, the series vibrator 652 is likewise connected to the signal line 33 at a succeeding stage thereof and the ladder type filter of the second stage in which the shunt vibrator 662 is connected between the output side of the series vibrator 652 and the ground line 34 is provided.

The respective series vibrators 651 and 652 and the shunt vibrators 661 and 662 are constituted so as to operate by being supplied with the DC bias voltage. For that reason, similarly as mentioned above, DC voltage supply means, for example, a DC feeding circuit having the DC power supply circuit 37 and the DC feed line 38 is provided and is connected to the beam which becomes a portion of the signal line 33 of the series vibrators 651 and 652 and the shunt vibrators 661 and 662 from the DC power supply circuit 37 through the DC feeding circuit, that is, the DC supply wiring 38.

Then, it is constituted such that there exists impedance mismatching between impedance of the signal line 33 in these of the series vibrators 651 and 652 and the shunt vibrators 661 and 662 and impedance of the DC supply wiring 38. More specifically, a device for forming impedance mismatching, for example, resistor devices R3 to R6 are connected between the signal line 33 in the series vibrators 651 and 652 and in the shunt vibrators 661 and 662, and the DC supply wiring 38. Further, there is connected the DC voltage stabilization circuit 10 composed of the resistor Ra and the capacitor Ca between this DC supply wiring 38 and the DC power supply input pad 22 which is connected to the DC power supply circuit 37. In this case, it is also possible to omit the resistor Ra.

The series vibrators 651 and 652 and the shunt vibrators 661 and 662 are constituted by MEMS electrostatic drive type vibrators 2 similarly as mentioned above. Then, the resistor device R3 is connected between the beam of the series vibrator 651 of the first stage and the DC supply wiring 38, and the resistor device R4 is connected between the beam of the shunt vibrator 661 and the DC supply wiring 38. Also, the resistor device R5 is connected between the beam of the series vibrator 652 of the second stage and the DC supply wiring 38, and the resistor device R6 is connected between the beam of the shunt vibrator 662 and the DC supply wiring 38.

The series vibrator 661 or 662 in FIG. 21 is constituted by parallelizing plural pieces of individual MEMS electrostatic drive type vibrators 2, for example, by an amount of 40 pieces. The shunt vibrator 661 or 662 is constituted by parallelizing plural pieces of, for example, 160 pieces of MEMS electrostatic drive type vibrators 2. The impedance Zs of the series vibrator 651 or 652 is composed, for example, of a series resistor Rx=5 kΩ and a ground capacitor C0=1×10$^{-13}$F. The impedance Zp of the shunt vibrator 661 or 662 is composed, for example, of a series resistor Rx=1 kΩ and a ground capacitor C0=8×10$^{-13}$F. The resistor devices R3, R4, R5 and R6 are formed, for example, by using thin lines according to polycrystalline silicon films and it is possible to make the resistance value thereof, for example, to be R3, R4, R5 or R6=1MΩ. Characteristic impedance of the signal line 33 shown in FIG. 21 is designed identically as the impedance Zp of the shunt vibrator 661 or 662.

The high frequency filter 61 of the third exemplified embodiment is constituted by forming a high frequency circuit block composed of the series vibrators 651 and 652 and the shunt vibrators 661 and 662, the DC power supply circuit 37 and the DC supply block including the DC voltage stabilization circuit 10 and the DC supply wiring 38 on a same semiconductor chip.

Figure 22:
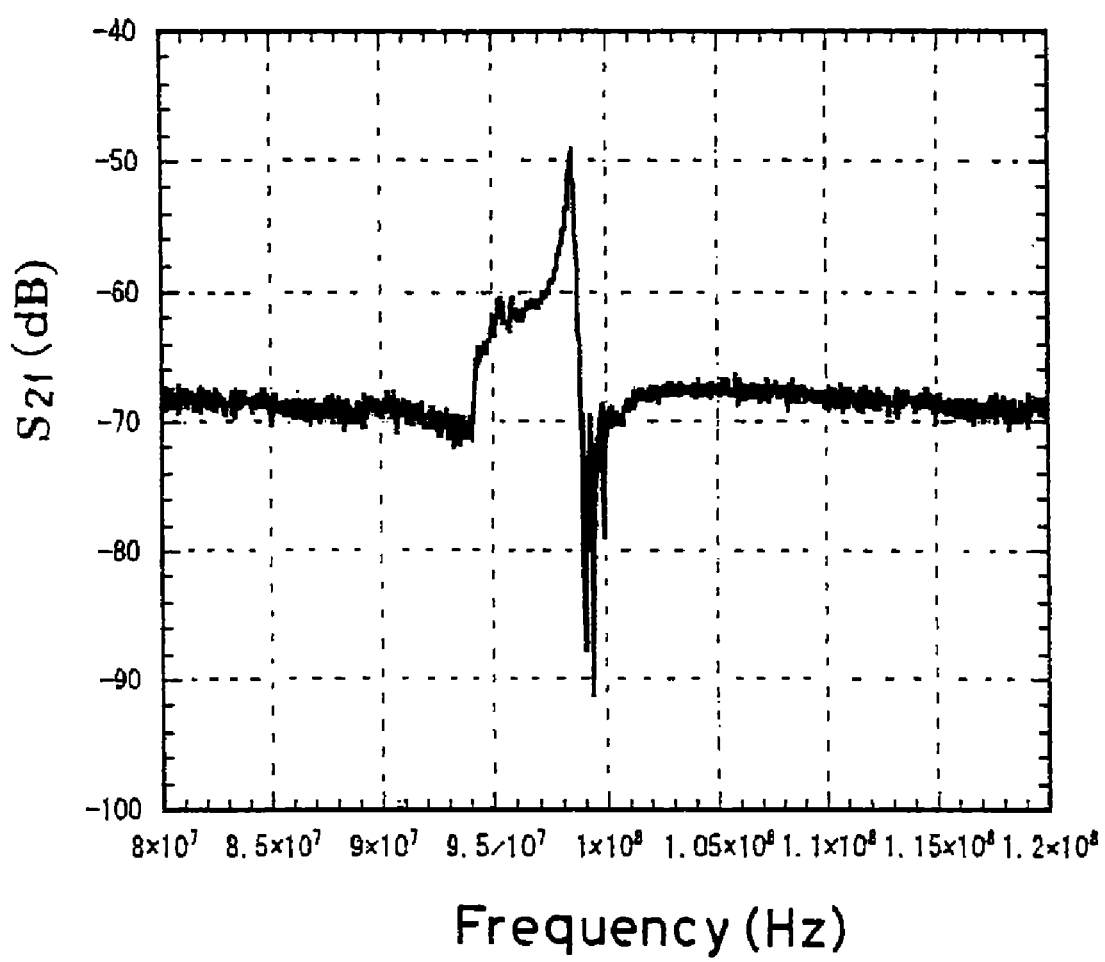
FIG. 22 a filter characteristic diagram showing frequency dependence property of permeability characteristic value of the ladder type filter of two stage constitution in FIG. 21.

FIG. 22 shows filter characteristic of the ladder type filter of two stage constitution 61 designated by the equivalent circuit in FIG. 21. More specifically, there is shown frequency dependence property of permeability characteristic value S21 (S parameter) in which the ladder type filter 61 constituted by using a MEMS beam type vibrator group fabricated according to a silicon semiconductor process is measured by using a network-analyzer 3767G manufactured by Advantec Co., Ltd. The series vibrators (vibrator group) 651 and 652 and the shunt vibrators (vibrator group) 661 and 662 were applied with DC-15V by using a common power supply. The resonant frequency of the series vibrators (vibrator group) 651 and 652 was set to be 98 MHz and the center frequency of the shunt vibrators (vibrator group) 661 and 662 was set to be 94 MHz which is lower than that of the series vibrators by 4 MHz respectively, and the measurement was carried out. As being clear from the characteristic curve of this FIG. 22, there is shown frequency characteristic as expected without noise. The effect of the shunt vibrators 661 and 662 is observed only in an unclear state and this is because the input impedance of the network-analyzer is 50Ω.

According to the ladder type filter of two stage constitution 61 of the third exemplified embodiment, bypassing of the high frequency signal through the DC supply wiring 38 is repressed by connecting the resistor devices R3, R4, R5 and R6 which achieve impedance mismatching between the beam forming a portion of the signal line 33 of the series vibrators 651 and 652 and the shunt vibrators 661 and 662 which are formed by MEMS electrostatic drive type vibrators and the DC supply wiring 38, and it is possible to improve signal to noise ratio of the high frequency signal for which filtering is performed. Also, there are not required a plurality of independent power supplies, so that it is possible to save the cost relating to the power supply.

In addition, the DC bias voltage is applied to the series vibrators 651 and 652 and the shunt vibrators 661 and 662 through the DC voltage stabilization circuit 10, so that it is possible to suppress time fluctuation of the high frequency signal which was applied with filtering. Also, it is possible to repress damage to the series vibrators 651 and 652 and the shunt vibrators 661 and 662 caused by the surge voltage to the minimum.

Figure 23:
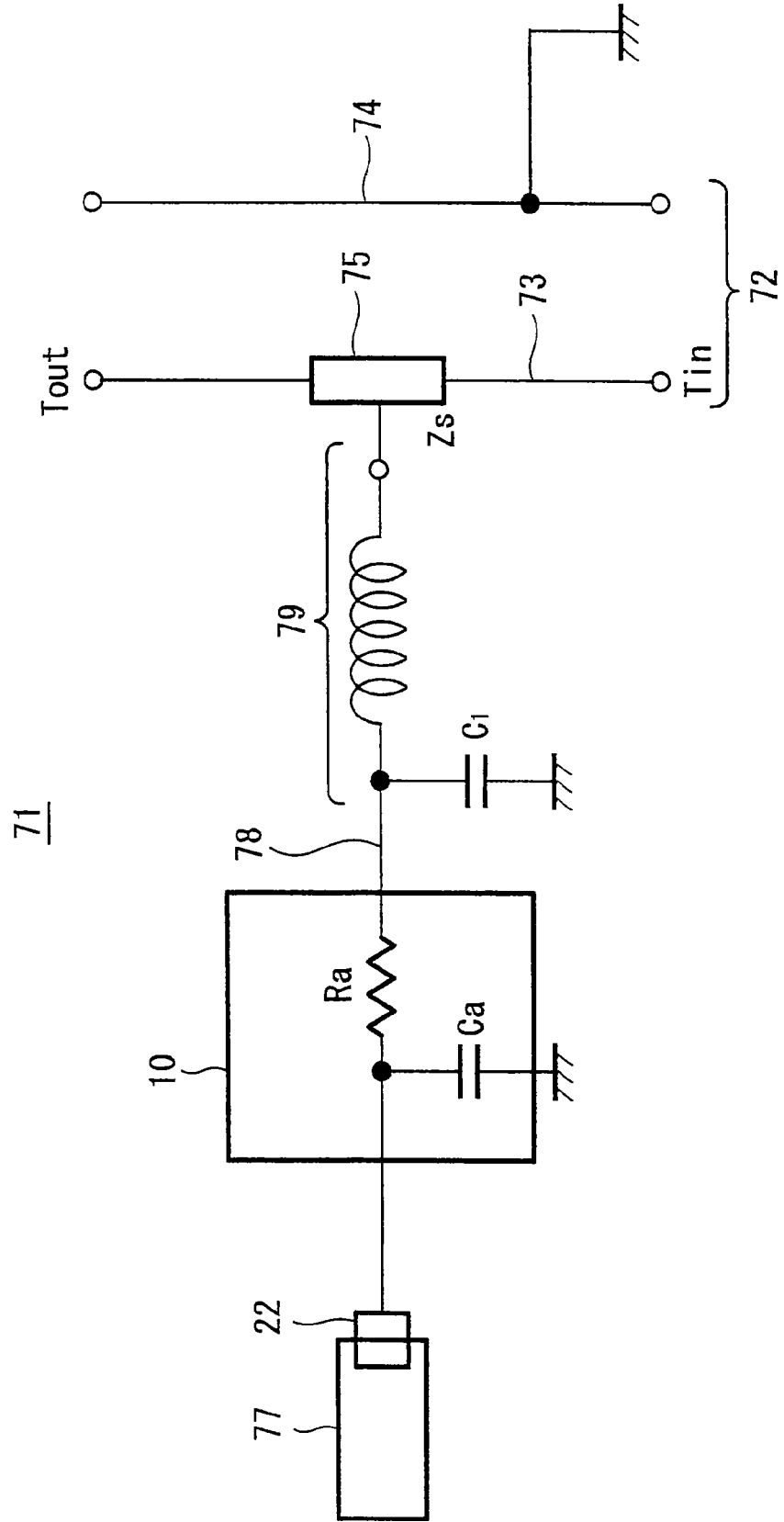
FIG. 23 is an equivalent circuit diagram showing a fourth exemplified embodiment in which a high frequency device relating to the present invention is applied to a high frequency resonator.

FIG. 23 is an equivalent circuit of a fourth exemplified embodiment in which a high frequency device relating to the present invention is applied to a high frequency resonator. A high frequency resonator 71 relating to the fourth exemplified embodiment is constituted by connecting a vibrator 75 which is constituted by a plurality of vibrators (vibrator group) parallelized between input/output terminals Tin and Tout of a signal line 73 of a high frequency signal line 72 constituted by a microstrip transmission line and by connecting a device making impedance to be mismatching effectively, that is, a low-pass filter 79 in this example between a DC supply wiring 78 from a DC power supply circuit 77 for operating this vibrator 75 and a beam which becomes a portion of the signal line of the vibrator 75. Further, there is connected the DC voltage stabilization circuit 10 composed of the resistor Ra and the capacitor Ca between this DC supply wiring 78 and the DC power supply input pad 22 which is connected to the DC power supply circuit 77. With respect to the vibrator 75, it is constituted by the MEMS electrostatic drive type vibrator of FIG. 1 and FIG. 2 similarly as mentioned above.

The vibrator 75 in FIG. 23 can be constituted similarly as mentioned above by parallelizing plural pieces of, for example, 50 pieces of MEMS beam type vibrators 2. Compound impedance Zs of the vibrator 75 is composed of a series resistor Rx=5 kΩ and a ground capacitor C0=1×10$^{-13}$F. Characteristic impedance of the signal line 73 of the high frequency signal line 72 is designed identically as the impedance Zs of the vibrator 75. Cl shows a stray capacitor of the DC supply wiring 78 or a capacitor forming a portion the lowpass circuit.

Figure 24:
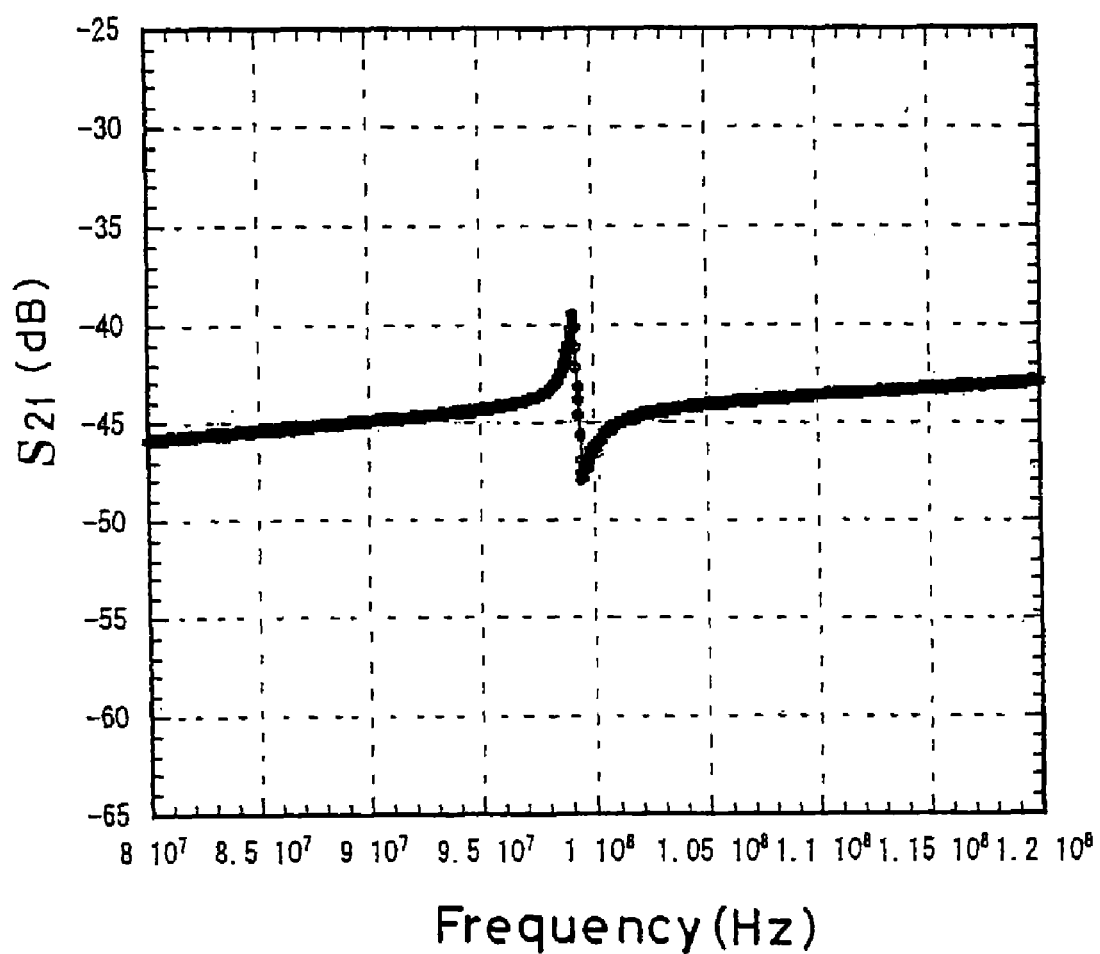
FIG. 24 a characteristic diagram showing frequency dependence property of permeability characteristic value of the high frequency resonator in FIG. 23.

FIG. 24 shows resonance characteristic of the high frequency resonator 71 which was designated by the equivalent circuit of FIG. 23. More specifically, there is shown frequency dependence property of permeability characteristic value S21 (S parameter) in which the high frequency resonator 71 constituted by using a MEMS electrostatic drive beam type vibrator group fabricated according to a silicon semiconductor process is measured by using a network-analyzer 3767G manufactured by Advantec Co., Ltd. The series vibrator group was applied with DC-20V by using the DC power supply circuit 77 installed with the low-pass filter 79. The beam of the vibrator 75 which becomes a portion of the signal line 73 and the low-pass filter 79 on the side of the DC power supply circuit 77 were connected by an Au thin line according to a wire-bond method. As being clear from FIG. 24, a resonance curved line without noises and having a peak in the vicinity of 98 MHz can be observed.

It should be noted in the example of FIG. 23 that the low-pass filter 79 was used as a device for making the impedance to be mismatching effectively, but it is also possible to use others such as an RC circuit, a resistor device and the like.

According to the high frequency resonator 71 of the fourth exemplified embodiment, it is possible, by connecting the low-pass filter 79 between the beam of the vibrator 75 formed by a MEMS electrostatic drive type vibrator which becomes a portion of the signal line 73 and the DC supply wiring 78, to repress unnecessary reflection of the high frequency signal through the DC supply wiring 78 and to improve signal to noise ratio of the high frequency signal of the resonant frequency.

In addition, the DC bias voltage is applied to the vibrator 75 through the DC voltage stabilization circuit 10, so that it is possible to suppress time fluctuation of the resonated high frequency signal. Also, it is possible to repress damage to the vibrator 75 caused by the surge voltage to the minimum.

In the above examples, the present invention was applied to a ladder type filter or a resonator in which a plurality of MEMS electrostatic drive type vibrators are constituted by electric coupling, but it is possible to apply to others such as a compound electrostatic drive vibrator type filter in which a plurality of MEMS beam type vibrators are constituted by mechanical coupling (see FIG. 8 and FIG. 9). In this case, it is made such that the DC bias voltage to the vibrators or the vibrator group which constitute a compound vibrator type filter is to be supplied in a state of mismatching with the impedance of the high frequency signal line. Thereby, it is possible to improve signal to noise ratio of the high frequency signal which was applied with filtering similarly as mentioned above and also, a plurality of independent power supplies are not necessary, so that it is possible to save the cost relating to the power supply.

A fifth exemplified embodiment of the present invention can be constituted such that the compound vibrators are located in parallel by a plurality of pieces so as to execute filtering of the high frequency signal in parallel. Then, the DC bias voltage to the vibrators or the vibrator group which constitute such a compound vibrator type filter is supplied in a state of mismatching with the impedance of the high frequency signal line, further, the DC bias voltage is supplied to the vibrators through the DC voltage stabilization circuit 10 and the like wherein they are constituted similarly as mentioned above.

Also in the high frequency resonator relating to this fifth exemplified embodiment, operational effects similar as mentioned above can be achieved.

In case of constituting a filter by a compound vibrator such as the ladder type filter, the compound vibrator type filter mentioned above or the like, it is possible, by making the wiring length between the adjacent vibrators (vibrators (vibrator group) constituted by a plurality of parallelized vibrators) and the wiring length between the filters of a plurality of stages to be adequately short as compared with the wavelength of the high frequency signal to be handled, to repress signal distortion caused by the delay of the high frequency signal.

In the above examples, the present invention was applied to high frequency filters and high frequency resonators, but it is possible to apply it to others such as passive devices of a high frequency switch, distributor and the like which use electrostatic drive type MEMS devices, a MEMS (Micro Electro Mechanical System) and the like.

It is possible for the high frequency devices of the present invention mentioned above to be constituted by being formed on a same wafer chip, that is, on a single semiconductor chip together with the high frequency circuit block constituting those and the power supply circuit block for operating this high frequency circuit block. Alternatively, it is possible for the high frequency device of the present invention to be constituted by, for example, being provided with a semiconductor chip on which the high frequency circuit block is formed and a semiconductor chip on which the aforesaid power supply circuit block is formed and by connecting both the chips with a wire.

Also, it is allowed for the means for mismatching the impedance to be inserted on the DC power supply circuit side or to be inserted on the high frequency signal device side.

It is possible for the filter according to the electrostatic drive type vibrator of each of the exemplified embodiments mentioned above to be used as a high frequency (RF) filter, an intermediate frequency (IF) filter or the like.

It is possible for the present invention to provide a communication apparatus including a filter according to the exemplified embodiment mentioned above, that is, for example, a mobile telephone, a wireless LAN apparatus, a wireless transceiver, a television tuner, a radio tuner or the like which is a communication apparatus to communicate by utilizing electromagnetic waves.

Next, a constitutional example of a communication apparatus applied with a filter of an exemplified embodiment of the above-mentioned present invention will be explained with reference to FIG. 25.

It will be first explained with respect to a constitution of a transmission system, in which transmission data of an I channel and transmission data of a Q channel are supplied to digital to analog converters (DACs) 201I and 201Q so as to be converted to analog signals respectively. The converted signals of the respective channels are supplied to band-pass filters 202I and 202Q in which signal components other than the transmission signal band are removed and outputs of the band-pass filters 202I and 202Q are supplied to a modulator 210.

In the modulator 210, signals are supplied to mixers 212I and 212Q through buffer amplifiers 211I and 211Q for respective channels and modulation is carried out by mixing a frequency signal corresponding to a transmission frequency which is supplied from a PLL (phase-locked loop) circuit 203 for transmission, and both of the mixing signals are added in an adder 214 so as to obtain a transmission signal of one system. In this case, the frequency signal supplied to the mixer 212I was shifted in its signal phase by a phase shifter 213 by 90° beforehand and it is constituted such that the signal of the I channel and the signal of Q channel are to be quadrature modulated.

An output of the adder 214 is supplied to a power amplifier 204 through a buffer amplifier 215 and amplified therein so as to become a predetermined transmission power. The signal amplified in the power amplifier 204 is supplied to an antenna 207 through a transmission and reception switcher 205 and a high frequency filter 206 and is wireless-transmitted from the antenna 207. The high frequency filter 206 is a band-pass filter for removing signal components other than the frequency band transmitted and received by this communication apparatus.

As a constitution of the receiving system, the signal received by the antenna 207 is supplied to a high frequency portion 220 through the high frequency filter 206 and the transmission and reception switcher 205. In the high frequency portion 220, the received signal is amplified in a low-noise amplifier (LNA) 221 and thereafter is supplied to a band-pass filter 222 in which signal components other than the receiving frequency band are removed, and the removed signal is supplied to a mixer 224 through a buffer amplifier 223. Then, a frequency signal supplied from a PLL circuit for channel selection 251 is mixed therein so as to make a signal of a predetermined transmission channel to be an intermediate frequency signal and the intermediate frequency signal is supplied to an intermediate frequency circuit 230 through a buffer amplifier 225.

In the intermediate frequency circuit 230, the supplied intermediate frequency signal is supplied to a band-pass filter 232 through a buffer amplifier 231 in which signal components other than the intermediate frequency signal band are removed and the removed signal is supplied to an automatic gain control circuit (AGC circuit) 233 so as to obtain a signal of an approximately constant gain. The intermediate frequency signal gain controlled in the automatic gain control circuit 233 is supplied to a demodulator 240 through a buffer amplifier 234.

In the demodulator 240, the supplied intermediate frequency signal is supplied to mixers 242I and 242Q through a buffer amplifier 241 in which a frequency signal supplied from a PLL circuit for intermediate frequency 252 is mixed and a signal components of I channel and a signal component of Q channel which were received are demodulated. In this case, it is constituted in a mixer 242I for the I signal such that a frequency signal whose signal phase is shifted by 90° in a phase shifter 243 is supplied thereto and a signal component of I channel and a signal component of Q channel which were quadrature modulated are to be demodulated.

The demodulated signals of the I channel and the Q channel are supplied to the band-pass filters 253I and 253Q through buffer amplifiers 244I and 244Q respectively in which signal components other than the signals of the I channel and the Q channel are removed and the removed signals are supplied to analog to digital converters (ADC) 254I and 254Q and are sampled therein so as to produce digital data thereof and reception data of the I channel and reception data of the Q channel are obtained.

In the constitution so far explained, it is possible to apply filters having constitutions of the above-mentioned exemplified embodiments to a portion of or all of the respective band-pass filters 202I, 202Q, 206, 222, 232, 253I, and 253Q so as to carry out band limitation therein.

According to a communication apparatus of this exemplified embodiment, it is possible to supply s stable DC bias voltage to an electrostatic drive type vibrator constituting a filter, so that it is possible to repress time fluctuation of the outputted high frequency signal or/and intermediate frequency signal and also, it is possible to prevent destruction of the vibrator caused by a high voltage pulse (surge voltage) applied thereto suddenly and it is possible to provide a communication apparatus of high reliability.

Figure 25:
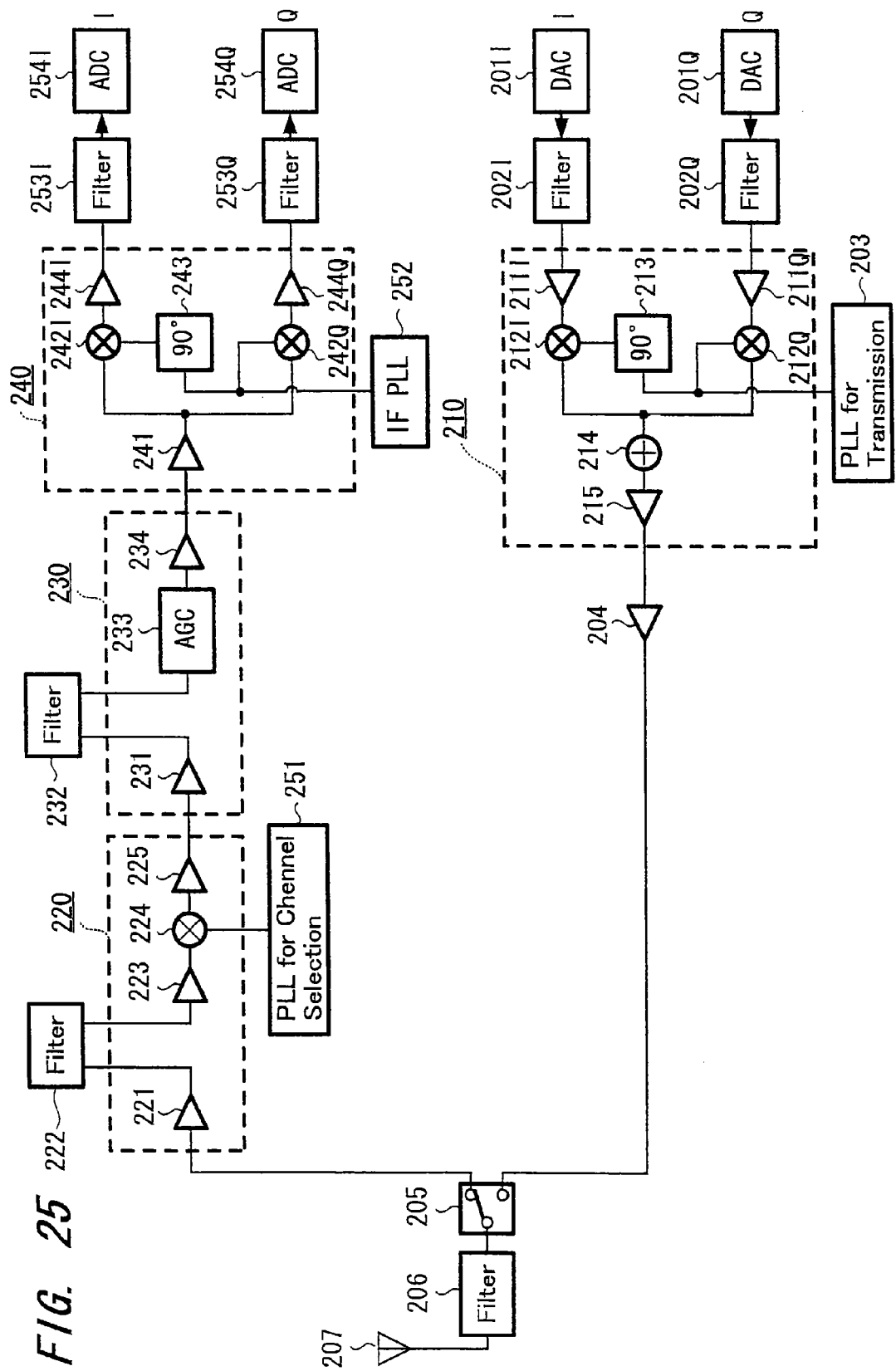
FIG. 25 a circuit diagram showing one exemplified embodiment of a communication apparatus relating to the present invention.

In the example of FIG. 25, the respective filters are constituted as band-pass filters, but it may also be allowed to constitute them as low-pass-filters which pass only a frequency band lower than a predetermined frequency or as high-pass-filters which pass only a frequency band higher than a predetermined frequency in which filters having the constitutions of the above-mentioned respective exemplified embodiment are to be applied to those filters. Also, in the example of FIG.

25, a communication apparatus carrying out wireless transmission and wireless reception was employed, but it may also be applied to a filter provided in a communication apparatus which carries out transmission and reception through a cable transmission line and further, it may also be allowed to apply the filters having constitutions of the above-mentioned exemplified embodiments to filters provided in a communication apparatus which carries out only a transmission process or in a communication apparatus which carries out only a receiving process.

The invention claimed is:

1. A high frequency device having a high frequency signal device, which comprises:
    an electrostatic type vibrator driven by means of a DC bias voltage,
    a pad to supply the DC bias voltage, and
    a circuit positioned electrically between said pad and said vibrator and configured to stabilize said DC bias voltage, said circuit including a resistor and a capacitor,
    wherein,
        said resistor is positioned serially in a DC feed line between said pad and said vibrator,
        said capacitor is coupled to said resistor and ground, and
        said circuit configured to stabilize the DC bias voltage and said high frequency signal device are provided on a common substrate.

2. The high frequency device according to claim 1, wherein said high frequency signal device has a vibrator group as a circuit element which carries out a signal process by passing a high frequency signal through a plurality of electrostatic type vibrators in parallel.

3. The high frequency device according to claim 1, wherein said capacitor of said circuit is positioned between an electric supply line and the ground.

4. The high frequency device according to claim 1, wherein said high frequency signal device has a function of generating a reference signal of a high frequency signal.

5. The high frequency device according to claim 1, wherein said high frequency signal device has a function of discriminating a signal of a desired frequency band from an inputted high frequency signal.

6. A high frequency device having a high frequency signal device, which comprises:
    an electrostatic type vibrator operated by being applied with a DC bias voltage,
    a pad to supply the DC bias voltage, and
    a circuit positioned electrically between said pad and said vibrator and configured to stabilize said DC bias voltage, wherein,
        said circuit having a function of stabilizing the DC bias voltage and said high frequency signal device are on a common substrate.

7. A power supply device serving for a drive of a high frequency signal device which comprises:
    an electrostatic type vibrator driven by a DC bias voltage,
    a pad to supply the DC bias voltage, and
    a circuit positioned electrically between said pad and said vibrator, and configured to stabilize the DC bias voltage, said circuit including a resistor and a capacitor,
    wherein,
        said resistor is positioned serially in a DC feed line between said pad and said vibrator,
        said capacitor is coupled to said resistor and ground, and
        said circuit configured to stabilize the DC bias voltage and said high frequency signal device are provided on a common substrate.

8. A communication apparatus comprising:
    a filter for carrying out band limitation of a transmission signal and/or a reception signal, wherein,
        said filter includes an electrostatic drive type vibrator driven by a DC bias voltage,
        a pad to supply said DC bias voltage,
        a circuit positioned electrically between said pad and said vibrator and configured to stabilize said DC bias voltage, said circuit including a resistor and a capacitor,
    wherein,
        said resistor is positioned serially in a DC feed line between said pad and said vibrator,
        said capacitor is coupled to said resistor and ground, and
        said circuit having a function of stabilizing the DC bias voltage is provided on a same substrate on which said filter is formed.

9. The communication apparatus according to claim 8, wherein said filter has a vibrator group as a circuit element which carries out a signal process by passing a high frequency signal or an intermediate frequency signal through a plurality of electrostatic type vibrators in parallel.

10. The communication apparatus according to claim 8, wherein the capacitor of said circuit is positioned electrically between an electric supply line and the ground.

11. A communication apparatus comprising:
    a filter for carrying out band limitation of a transmission signal and/or a reception signal,
    wherein
    said filter includes an electrostatic drive type vibrator driven by a DC bias voltage,
    a pad to supply said DC bias voltage, and
    a circuit positioned electrically between said pad and said vibrator and configured to stabilize said DC bias voltage, and
    wherein,
    said circuit, having a function of stabilizing the DC bias voltage, and said filter are on a common substrate.

* * * * *